(12) United States Patent
Wang et al.

(10) Patent No.: US 11,024,220 B2
(45) Date of Patent: Jun. 1, 2021

(54) FORMATION OF A LIGHT-EMITTING DIODE DISPLAY

(71) Applicant: Invensas Corporation, San Jose, CA (US)

(72) Inventors: Liang Wang, Newark, CA (US); Rajesh Katkar, Milpitas, CA (US); Javier A. Delacruz, San Jose, CA (US); Ilyas Mohammed, Santa Clara, CA (US); Belgacem Haba, Saratoga, CA (US)

(73) Assignee: Invensas Corporation, San Jose, CA (US)

( * ) Notice: Subject to any disclaimer, the term of this patent is extended or adjusted under 35 U.S.C. 154(b) by 139 days.

(21) Appl. No.: 15/994,987

(22) Filed: May 31, 2018

(65) Prior Publication Data

US 2019/0371229 A1   Dec. 5, 2019

(51) Int. Cl.
  *G09G 3/32* (2016.01)
  *G09G 3/20* (2006.01)
  *H01L 33/58* (2010.01)
  *H01L 33/38* (2010.01)

(52) U.S. Cl.
  CPC ............ *G09G 3/32* (2013.01); *G09G 3/2003* (2013.01); *H01L 33/387* (2013.01); *H01L 33/58* (2013.01); *G09G 2310/0264* (2013.01)

(58) Field of Classification Search
  None
  See application file for complete search history.

(56) References Cited

U.S. PATENT DOCUMENTS

| 7,323,721 | B2 | 1/2008 | Liao et al. |
| 9,899,329 | B2 | 2/2018 | Bower |
| 10,217,729 | B2 | 2/2019 | Ahmed et al. |
| 10,242,892 | B2 | 3/2019 | Chang et al. |
| 2010/0159645 | A1* | 6/2010 | Yanagida ............ H01L 21/56 438/113 |
| 2011/0073889 | A1* | 3/2011 | Sugizaki ........... H01L 33/0095 257/98 |

(Continued)

FOREIGN PATENT DOCUMENTS

WO   2018/191883 A1   10/2018

OTHER PUBLICATIONS

Herzer et al., "Fabrication of Patterned Silane Based Self-Assembled Monolayers by Photolithography and Surface Reactions on Silicon-Oxide Substrates", Chemical Communications, The Royal Society of Chemistry, issue 31, 2010, pp. 5634-5652 (20 pages).

(Continued)

*Primary Examiner* — Christopher R Lamb

(57) ABSTRACT

Apparatus and method relating generally to an LED display is disclosed. In such an apparatus, a driver die has a plurality of driver circuits. A plurality of light-emitting diodes, each having a thickness of 10 microns or less and discrete with respect to one another, are respectively interconnected to the plurality of driver circuits. The plurality of light-emitting diodes includes a first portion for a first color, a second portion for a second color, and a third portion for a third color respectively obtained from a first, a second, and a third optical wafer. The first, the second, and the third color are different from one another.

17 Claims, 14 Drawing Sheets

(56) References Cited

U.S. PATENT DOCUMENTS

| | | | |
|---|---|---|---|
| 2015/0249069 A1* | 9/2015 | Yoshida | H01L 33/62 257/89 |
| 2016/0351539 A1* | 12/2016 | Bower | H01L 25/0655 |
| 2017/0301283 A1* | 10/2017 | Liu | G09G 3/3233 |
| 2017/0357127 A1* | 12/2017 | Cok | G02F 1/133606 |
| 2018/0269191 A1* | 9/2018 | England | H01L 25/0753 |
| 2019/0066571 A1* | 2/2019 | Goward | H05K 3/40 |
| 2020/0194635 A1 | 6/2020 | Yuasa et al. | |

OTHER PUBLICATIONS

Lafleur et al., "Using Molecular Monolayers as Self-Assembled Photoresist," Digest of Technical Papers, Transducers '05, The 13th International Conference on Solid-State Sensors, IEEE document #1497506, 2005, pp. 2052-2056 (5 pages).

Love et al., "Self-Assembled Monolayers of Thiolates on Metals as a Form of Nanotechnology," Dept. of Chemistry, University of Illinois and Harvard University, Chem. Rev. 105(4): 2005, pp. 1103-1170 (68 pages).

Xia et al., "Smart Responsive Surfaces Switching Reversibly Between Super-Hydrophobicity and Super-Hydrophilicity,"Soft Matter, Spring 2009, 5, pp. 275-281 (5 pages).

\* cited by examiner

FORMATION OF A LIGHT-EMITTING DIODE DISPLAY

FIELD

The following description relates to microelectronic devices. More particularly, the following description relates to formation of a light-emitting diode display.

BACKGROUND

High-density displays are becoming more useful, especially for virtual reality and augmented reality applications. However, conventional formation of high-density light-emitting diode displays have had has issues with respect to density.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

FIG. 2-1 is a circuit diagram depicting an exemplary portion of a driver circuit array.

FIG. 2-2 is an enlarged view depicting an exemplary cell, such as a driver circuit array as in FIG. 2-1.

FIGS. 4-1 through 4-3 are a progression of block diagrams of cross-sectional views depicting exemplary portions of respective light-emitting diode ("LED") wafers.

FIGS. 5-1 through 5-3 ("FIG. 5") is a block-flow diagram depicting an exemplary LED display forming process ("display process").

FIGS. 6-1 through 6-3 ("FIG. 6") is a block-flow diagram depicting another exemplary display process.

FIGS. 8-1 through 8-5 are a progression of block diagrams of cross-sectional views depicting an exemplary wafer-to-wafer ("W2W") processing of paired wafers.

FIG. 9-1 is a plan view depicting an exemplary LED patterned contact.

FIG. 9-2 is a plan view depicting another exemplary LED patterned contact.

FIGS. 10-1 and 10-2 ("FIG. 10") is a block-flow diagram depicting another exemplary display process.

DETAILED DESCRIPTION

Figure 1:
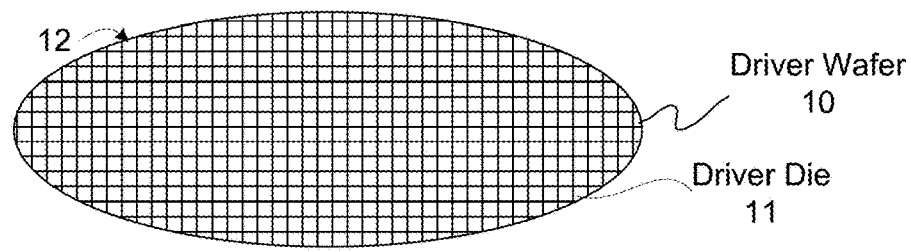
FIG. 1 is a perspective view depicting an exemplary driver wafer.

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

An apparatus relates generally to a light-emitting diode display. In such an apparatus, a driver die has a plurality of driver circuits. A plurality of light-emitting diodes, each having a thickness of 10 microns or less, are discretely with respect to one another interconnected to the plurality of driver circuits. The plurality of light-emitting diodes includes a first portion for a first color, a second portion for a second color, and a third portion for a third color respectively obtained from a first, a second, and a third optical wafer. The first, the second, and the third color are different from one another.

A method relates generally to forming a light-emitting diode display. In such a method, a substrate having a driver wafer having an interconnect layer and a plurality of driver circuits is obtained. At least a first, a second, and a third optical wafer respectively having a first, a second, and a third plurality of light-emitting diodes for a first, a second, and a third color, respectively, are obtained. The first, second, and third optical wafer are positioned for successively selectively applying a beam for releasing the first, the second, and the third plurality of light-emitting diodes on the driver wafer in first positions, second positions, and third positions, respectively, to provide pixels for the light-emitting diode display. Each discrete diode of the first, the second, and the third plurality of light-emitting diodes released has a thickness of no more than 10 microns.

Along those lines, the first, the second, and the third color are different from one another. The first optical wafer is positioned proximate to the interconnect layer. A beam is selectively applied to the first optical wafer to release at least one of the first plurality of light-emitting diodes from the first optical wafer to the interconnect layer for interconnection with a first portion of the plurality of driver circuits. The second optical wafer is positioned proximate to the interconnect layer. The beam is selectively applied to the second optical wafer to release at least one of the second plurality of light-emitting diodes from the second optical wafer to the interconnect layer for interconnection with a second portion of the plurality of driver circuits. The third optical wafer is positioned proximate to the interconnect layer. The beam is selectively applied to the third optical wafer to release at least one of the third plurality of light-emitting diodes from the third optical wafer to the interconnect layer for interconnection with a third portion of the plurality of driver circuits.

Other features will be recognized from consideration of the remainder of the Detailed Description and Claims, which follow.

Use of terms such as "upper" and "lower" or other directional terms is made with respect to the reference frame of the figures and is not meant to be limiting with respect to potential alternative orientations, such as in further assemblies or as used in various systems.

For an integrated circuit ("IC"), an upper surface may generally be associated with what is referred to as a "front side" of an in-process wafer, and lower surface may generally be associated with what is referred to as a "backside" of an in-process wafer. Along those lines, a front-side of an in-process wafer may be used for forming what is referred to as front-end-of-line ("FEOL") structures and back-end-of-line ("BEOL") structures. Generally, FEOL structures may include shallow trench isolations ("STI"), transistor gates, transistor source/drain regions (not shown), transistor gate dielectrics (not shown), contact etch stop layer ("CESL"; not shown), a pre-metallization dielectric or pre-metal dielectric ("PMD"), and contact plugs, among other FEOL structures. A PMD may be composed of one or more layers. Generally, BEOL structures may include one or more inter-level dielectrics ("ILDs") and one or more levels of metallization ("M"). Additionally, metal from a metallization level may extend through one or more ILDs, as is known. Furthermore, each level of metallization may be composed of one or more metal layers. A passivation level may be formed on a last metallization layer. Such passivation level may include one or more dielectric layers, and further may include an anti-reflective coating ("ARC"). Furthermore, a redistribution layer ("RDL") may be formed on such passivation level. Conventionally, an RDL may include: a dielectric layer, such as a polyimide or silicon oxide layer for example; another metal layer on such dielectric layer and connected to a bond pad of a metal layer of a last metallization level; and another dielectric layer, such as another polyimide or silicon oxide layer or a silicon nitride layer for example, over such RDL metal layer while leaving a portion thereof exposed to provide another bond pad. A terminal opening may expose such other bond pad of such RDL metal layer. Thereafter, a hybrid bond pad, solder bump or wire bond may be conventionally coupled to such bond pad.

As part of a FEOL or BEOL structure formation, a plurality of via structures may extend within openings formed in substrate which extend into substrate. Via structures may be generally in the form of any solid of any shape formed by filling or plating, in whole or in part, an opening formed in substrate. Examples of such solid shapes generally include cylindrical, conical, frustoconical, rectangular prismatic, cubic, or the like.

Conventionally, via structures may extend from upper surface down toward lower surface, and after a backside reveal, via structures may extend between surfaces, as effectively thickness of substrate may be thinned so as to reveal lower end surfaces of via structures. Via structures extending through a substrate between surfaces, though they may extend above or below such surfaces, respectively, may be referred to as through-substrate-vias. As substrates are often formed of silicon, such through-substrate-vias are commonly referred to as TSVs, which stands for through-silicon-vias.

A lower surface of a substrate may have formed thereon a passivation layer, which may be formed of one or more dielectric layers. Furthermore, a passivation layer may be a polymer layer. For example, a passivation layer may be a benzocyclobutene ("BCB") layer or a combination of a silicon oxide or silicon nitride layer and a BCB layer. In some applications, a passivation layer may be referred to as an inter-die layer. A metal layer, such as a copper, copper alloy, or other metal previously described, may be formed on a passivation layer and on lower end contact surfaces of via conductors. This metal layer may be an RDL metal layer. Solder or other eutectic bumps, balls or other electrically conductive masses formed of a bonding material may be respectively formed on bonding pads, where such pads may be formed on or as part of a metal layer.

More recently, TSVs have been used to provide what is referred to as three-dimensional ("3D") ICs or "3D ICs." Generally, attaching one die to another using, in part, TSVs may be performed at a bond pad level or an on-chip electrical wiring level. ICs may be diced from a wafer into single dies. Such single dies may be bonded to one another or bonded to a circuit platform, as previously described. For purposes of clarity by way of example and not limitation, it shall be assumed that an interposer is used for such circuit platform.

Interconnection components, such as interposers, may be in electronic assemblies for a variety of purposes, including facilitating interconnection between components with different connection configurations or to provide spacing between components in a microelectronic assembly, among others. Interposers may include a semiconductor layer, such as of silicon or the like, in the form of a sheet or layer of material or other substrate having conductive elements such as conductive vias extending within openings which extend through such layer of semiconductor material. Such conductive vias may be used for signal transmission through such interposer. In some interposers, ends of such vias may be used as contact pads for connection of such interposer to other microelectronics components. In other examples, one or more RDLs may be formed as part of such interposer on one or more sides thereof and connected with one or both ends of such vias. An RDL may include numerous conductive traces extending on or within one or more dielectric sheets or layers. Such traces may be provided in one level or in multiple levels throughout a single dielectric layer, separated by portions of dielectric material within such RDL. Vias may be included in an RDL to interconnect traces in different levels of such RDL.

While a stacked die or a package-on-package die may include TSV interconnects, other interconnects may be implemented for a 3D IC packaged component. For example, a Cu/Sn microbump transient liquid phase ("TLP") bonding technology or copper to copper hybrid bonding technology (e.g. direct bond interconnects, or Direct Bond Interconnect ("DBI")) may be used for bonding ICs to one another. Interconnect layers may be on one an upper and/or a lower side of an IC of a 3D stack. For Direct Bond Interconnect, metal bond pads may be recessed in a dielectric layer over which a plasma activation may be performed to allow for metal-to-metal bonding, die-to-wafer or wafer-to-wafer, at low temperatures.

ICs in a 3D stack optionally may be coupled to an interposer or interposer die. An interposer may be an active die or a passive die. An interposer may be coupled to a package substrate. A package substrate may be formed of thin layers called laminates or laminate substrates. Laminates may be organic or inorganic. Examples of materials for "rigid" package substrates include an epoxy-based laminate such as FR4, a resin-based laminate such as bismaleimide-triazine ("BT"), a ceramic substrate, a glass substrate, or other form of package substrate. An under fill for a flip chip attachment may encapsulate C4 bumps or other solder balls used to couple an interposer and a package substrate. A heat spreader/heat sink ("heat sink") may be attached to a package substrate, and such heat sink and substrate package in combination may encase ICs and an interposer of a 3D stack. A thermal paste may couple an upper surface of an IC to an internal surface of a heat sink. Ball grid array ("BGA") balls or other array interconnects may be used to couple a package substrate to a circuit platform, such as a PCB for example.

3D wafer-level packaging ("3D-WLP") may be used for interconnecting two or more ICs, one or more ICs to an interposer, or any combination thereof. Optionally, ICs may be interconnected die-to-die ("D2D") or chip-to-chip ("C2C"). Further, optionally, ICs may be interconnected die-to-wafer ("D2W") or chip-to-wafer ("C2W"). Accordingly, any of a variety of die stacking or chip stacking approaches may be used to provide a 3D stacked IC ("3D-SIC" or "3D-IC"). Again, wafer 101 may be for one or more dies of a system-in-a-package ("SiP") or an interposer, namely generally for one or more dies used for or in D2D, W2D, or WLP interconnections for forming a 3D IC.

FIG. 1 is a perspective view depicting an exemplary driver wafer 10. Driver wafer 10 includes a plurality of driver dies 11, as generally delineated with scribe lines 12.

Figures 1, 2:
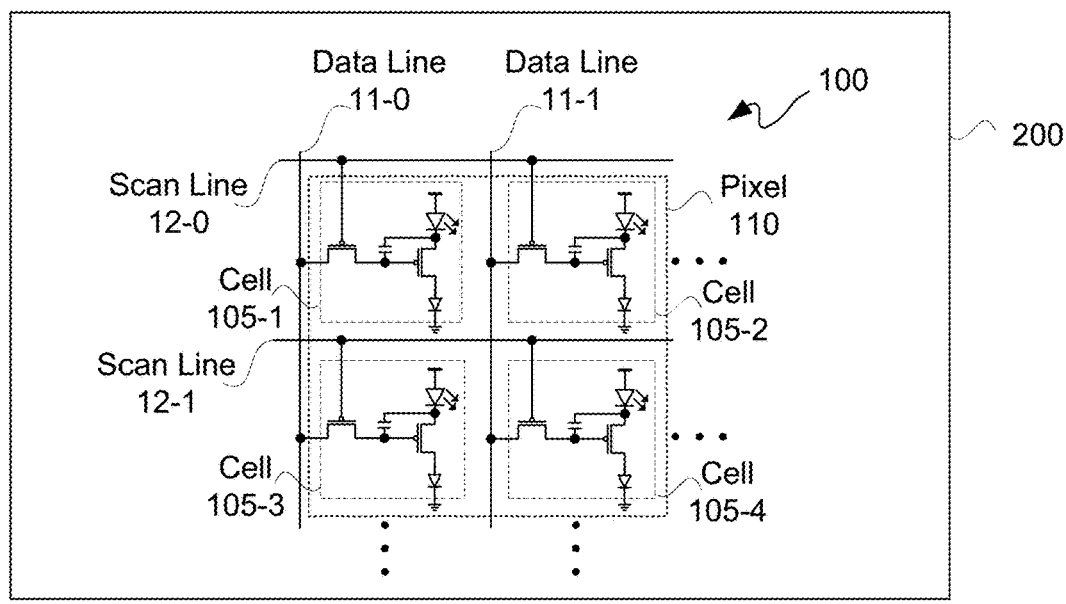
Figure 2:
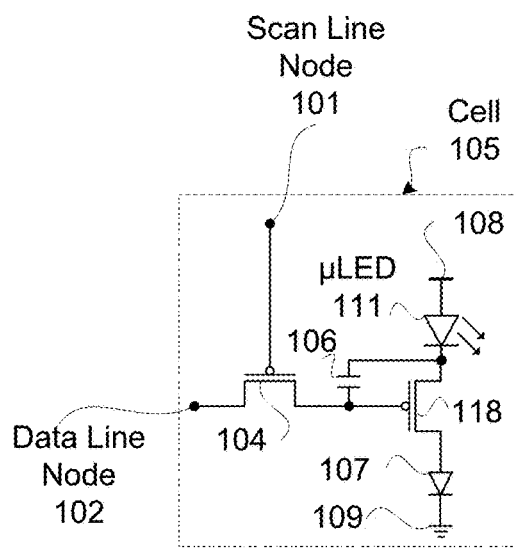

FIG. 2-1 is a circuit diagram depicting an exemplary portion of a driver circuit array 100. A driver circuit array 100 may include many more driver circuit cells ("cells") than cells 105-1 through 105-4 illustratively depicted. Driver circuit array 100 may be of a light-emitting diode ("LED") display 200.

Cells 105 of driver circuit array 100 are partly formed in a driver die, such as a driver die 11 of FIG. 1 of a driver wafer 10. Another part of cells 105 of driver circuit array 100 may be formed on a separate platform, such as a substrate for example. This separate substrate may be attached to a driver wafer 10 to form cells 105 of driver circuit array 100. Each of such cells 105 thus may be considered a stacked circuit cell 105, as such cells are formed by combining a driver wafer 10 and a separate substrate, as described below in additional detail.

Each of cells 105 of a row may be interconnected to a scan line. For example, a pass gate respectively of cells 105-1 and 105-2 is interconnected to a scan line 12-0, and a pass gate respectively of cells 105-3 and 105-4 is interconnected to scan line 12-1.

Each of cells 105 of a column may be interconnected to a data line. For example, an output node respectively of cells 105-1 and 105-2 is interconnected to a data line 11-0, and an output node respectively of cells 105-3 and 105-4 is interconnected to a data line 11-1.

More particularly, FIG. 2-2 is an enlarged view depicting an exemplary cell 105, such as of driver circuit array 100 of FIG. 2-1. In this example, cell 105 includes transistors 104 and 118, a diode 107, a capacitor 106, and a "micro-light-emitting diode" ("µLED") 111. By "µLED," it is generally meant an LED formed using a µLED process technology to have an LED with a thickness 135 of FIGS. 4-1 through 4-3 of no greater than 10 microns. In this example, transistors 104 and 118 are PMOS transistors; however, in another example another polarity of transistor or another type of gating device may be used. Along those lines, dimensions of µLEDs do not necessarily mean than dimensions of LED-based pixels or LED screen displays are similarly small, though they can be. Generally, use of µLEDs facilitates higher densities of LED-based pixels or LED screen displays, which sometimes results in higher resolutions.

A gate of pass gate transistor 104 is connected to a scan line node 101, and a drain node of pass gate transistor 104 is connected to a data line node 102. A source node of pass gate transistor 104 is connected to a bottom node of capacitor 106 and to a gate of a driver transistor 118.

A top node of capacitor 106 is connected to a source node of driver transistor 118 and to a cathode node of µLED 111. An anode node of µLED 111 is connected to a voltage supply node 108.

A drain node of driver transistor 118 is connected to an anode node of diode 107. A cathode node of diode 107 is connected to a ground node 109.

Figure 3:
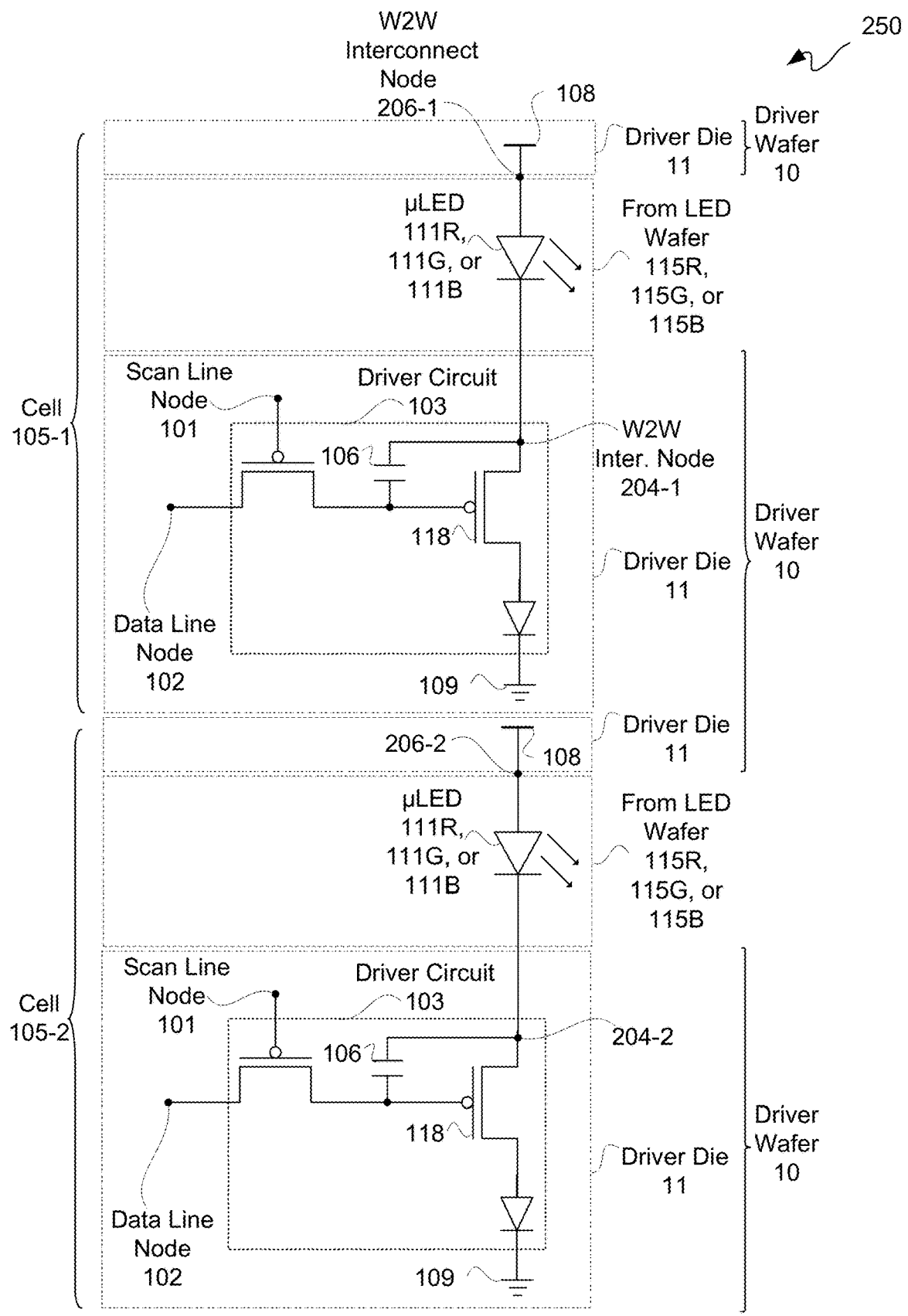
FIG. 3 is a block-circuit diagram depicting an exemplary portion of a wafer-to-wafer ("W2W") stack for forming a driver circuit array as in FIG. 2-1.

FIG. 3 is a block-circuit diagram depicting an exemplary portion of a wafer-to-wafer ("W2W") stack 250 for forming a driver circuit array 100 of FIG. 2-1. Even though only cells 105-1 and 105-2 are illustratively depicted, it should be appreciated that multiple cells, as well as multiple driver circuit arrays, may be formed using a W2W stack 250.

Cells 105-1 and 105-2 include respective driver circuits 103. Each of driver circuits 103 may include all of the components of a cell 105 except for a µLED 111. Driver circuits 103 may be formed in arrays in one or more driver dies 11 of a driver wafer 10 with nodes or contacts 204-1 and 204-2 respectively of cells 105-1 and 105-2 being W2W interconnect nodes or contacts.

An interconnect node 204, a source node of a driver transistor 118 and a top node of capacitor 106 of each of cell 105 may be a common node with respect to one another. Interconnect nodes 204-1 and 204-2 may be exposed in-process for interconnection of cathode nodes of respective µLEDs 111 from corresponding LED wafers 115.

In this example, there are three types of µLEDs 111, namely a red µLED 111R, a green µLED 111G, and a blue µLED 111B. Such a red µLED 111R, a green µLED 111G, and a blue µLED 111B may be respectively obtained from a red LED wafer 115R, a green LED wafer 115G, and a blue LED wafer 115B, as described below in additional detail.

In this example, one or more driver dies 11 of a driver wafer 10 include a voltage supply bus including one or more voltage supply nodes 108. Interconnect nodes 206-1 and 206-2 may be in common with a one or more voltage supply nodes 108 of cells 105-1 and 105-2. Interconnect nodes 206-1 and 206-2 may be exposed in-process for interconnection of anode nodes of respective µLEDs 111 from corresponding LED wafers 115.

Generally, a plurality of µLEDs 111 of different colors may be respectively interconnected to a corresponding plurality of driver circuits 103. For such plurality of LEDs, a first portion thereof may be for a first color, such as for example red; a second portion thereof may be for a second color, such as for example green; and a third portion thereof may be for a third color, such as for example blue. These are just one set of colors that may be used for a display, and other sets of different colors may be used for providing an LED display. Such RGB µLEDs 111 may respectively be obtained from a first, a second, and a third optical wafer 115, such as respectively LED wafers 115R, 115G, and 115B.

Moreover, while µLEDs 111 are described herein for purposes of size, the technology as described herein is not limited to µLEDs 111. Rather, other types of optical emitter devices for a display may be used that have same or smaller dimensions than µLEDs 111 on an optical wafer 115. Presently, for µLED-based displays, pixel sizes may range from 2 square microns to a few square millimeters with smaller panel sizes generally having smaller pixel sizes. A µLED-based display may have a pixel pitch of greater than 25 microns for a pixel area of 625 square microns. This is just one example, and other examples of µLED-based displays may exist.

Figure 7:
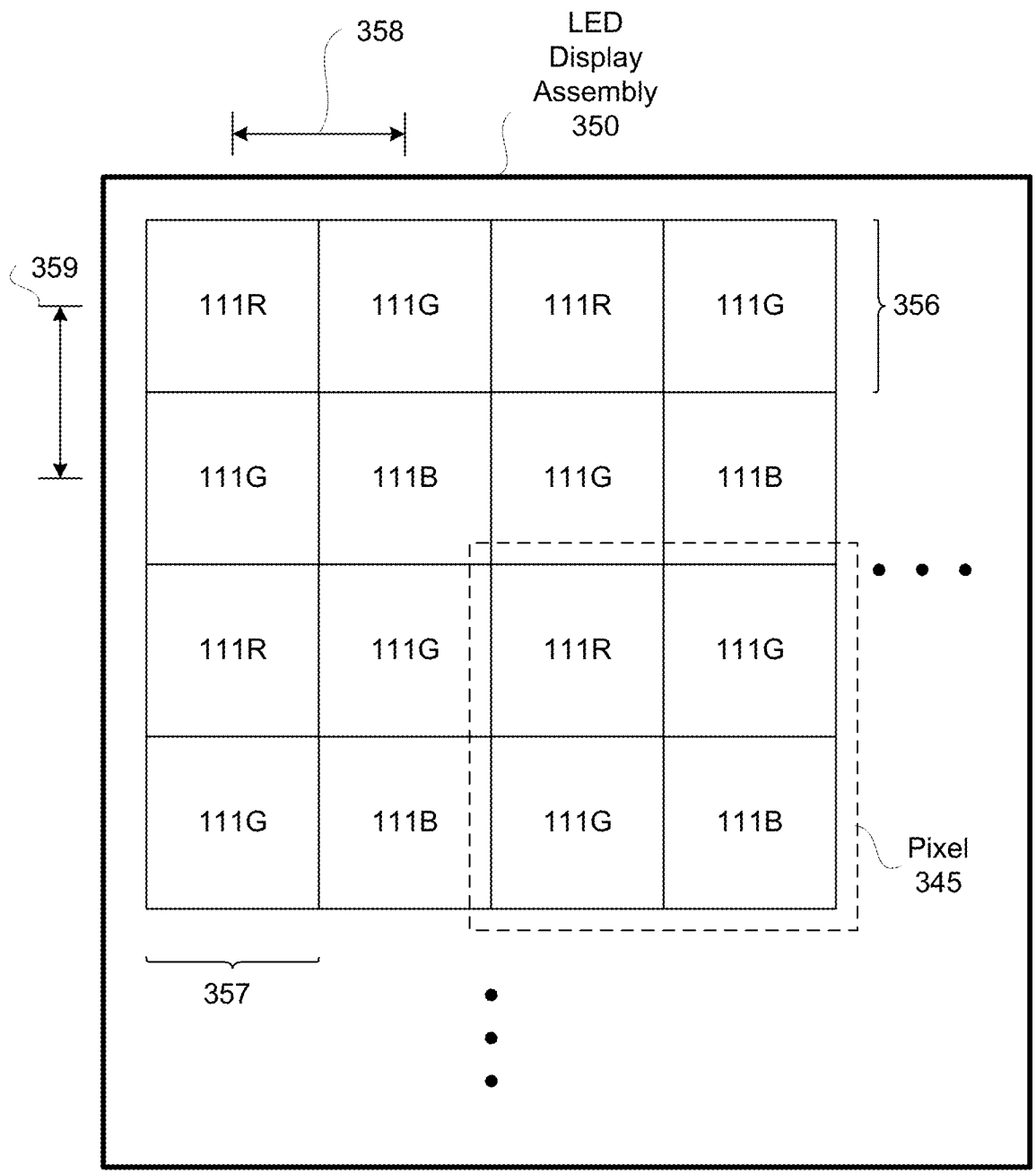
FIG. 7 is a top down block diagram of a plan view depicting an exemplary LED display assembly having pixels.

Generally, for a small LED display assembly 350 of FIG. 7, such as for a VR, AR, or mobile phone device for example, with a high resolution pixel density, a largest pitch of adjacent ones of µLEDs 111 in a pixel 345 of FIG. 7 is not greater than 5 microns, and pixel area dimensions of a set of µLEDs 111 in a pixel for such a small LED display assembly is reduced by having all of such µLEDs 111 in such a pixel area with no greater than 10 microns a side, namely x- and y-dimensions, dimension. Generally, for a medium LED display assembly 350 of FIG. 7, such as a pad or notebook device for example, with a medium resolution pixel density, a largest pitch of adjacent ones of µLEDs 111 in a pixel 345 of FIG. 7 for such a medium LED display assembly is not greater than 50 microns for such pixel area, and pixel area dimensions of a set of μLEDs 111 in a pixel for such a medium LED display assembly is not greater than 100 microns a side for such pixel area. Generally, for a large LED display assembly 350 of FIG. 7, such as a TV or desktop display device for example, with a low resolution pixel density, a largest pitch of adjacent ones of μLEDs 111 in a pixel 345 of FIG. 7 for such a large LED display assembly is not greater than 500 microns, and pixel area dimensions of a set of μLEDs 111 in a pixel for such a large LED display assembly is not greater than 1000 microns a side for such pixel area.

Moreover, even though the following description is for μLED-based displays, the technology described herein is not limited to μLED-based displays but may be applied for example to non-display applications. Such non-display applications may include one or more of LiFi, optogenetics, lithography tools, and/or lighting, among other applications involving μLEDs or optical emitter devices.

As is known, μLED chips or dies can be singulated from a wafer and transferred as individual μLEDs or as larger monolithic arrays, namely of a particular color. Generally, μLED-based displays are formed by processing a bulk LED substrate into an array of μLEDs, which are poised for pick-up and transfer onto a receiving substrate for integration into a heterogeneous system of μLEDs, transistors, optics, and other display components. In a massively parallel system, individual μLED dies or small groups of μLED-based chips having small amounts, namely less than 1000, of μLED emitters are singulated and individually picked-up, transferred, positioned, and assembled onto a backplane. This backplane, conventional thin-film transistors ("TFTs") on a glass or a flexible substrate, includes pixel driving circuitry. However, the pitch of circuitry on such a carrier or backplane is generally lower than that of placed singulated μLEDs. This limits ability to provide a high-resolution display. Along those lines, for sub-pixel sizes of less than 10 to 10,000 square microns, this approach of having individual or small groups of μLEDs placed from separate epitaxial or other optical wafers, such as R, G, and B epitaxial wafers, is impractical. Moreover, for AR and VR applications with sub-pixel sizes of much less than 10 square microns, this pick and place approach of μLEDs is not feasible.

In contrast, large chips having large quantities of μLED emitters, such as greater than 10,000 to tens of millions, may be hybridized onto a backplane, conventionally a silicon CMOS-based backplane. However, this results in large pixels and is not suitable for high-resolution displays.

A high-resolution display suitable for AR and/or VR, or other near eye, applications may generally have a panel size in a range of 0.1×0.1 inches (2.54×2.54 cm) to 4×4 inches (10.16×10.16 cm) with a pixels-per-inch ("PPI") in a range of 100 to 5000 for a pixel size in a range of 2 to 4 microns for a pixel volume of at least 6 million, generally a range of 6 to 20 million or higher. To address the need for such a high-resolution display that overcomes one or more of the limitations of the current pick and place technology, the following description is provided.

Along those lines, for integrating μLEDs 111 and driver circuits 103, a brightness or luminance of greater than 80K cd/square-m may be met by direct μLEDs for each pixel. An active matrix driver integrated circuit ("IC") may be used to control each μLED-based display integrated down to as low as four μLEDs per pixel.

Figures 1, 4:
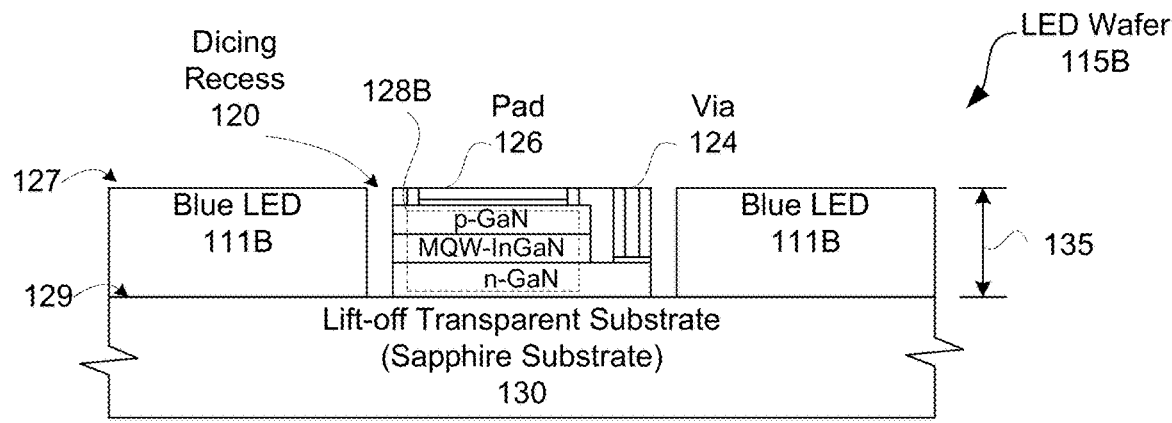
Figures 2, 4:
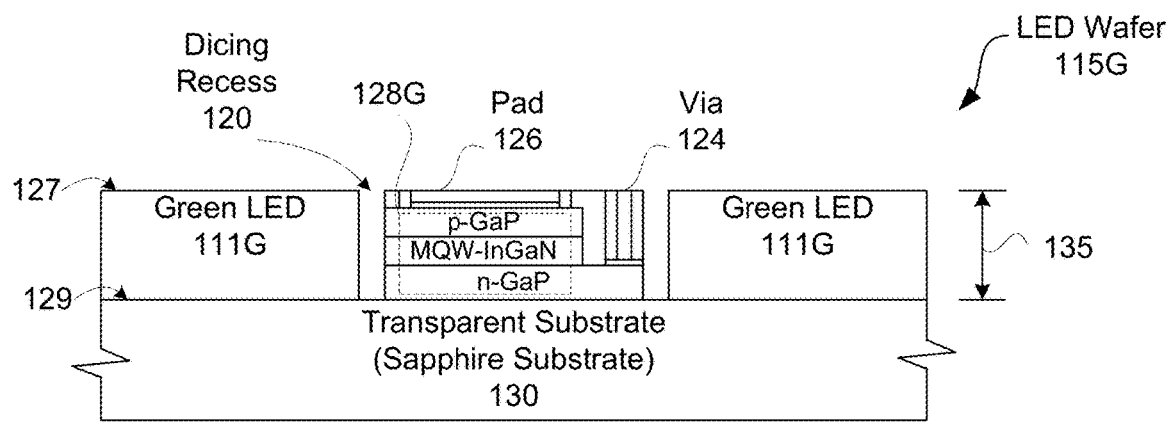
Figures 3, 4:
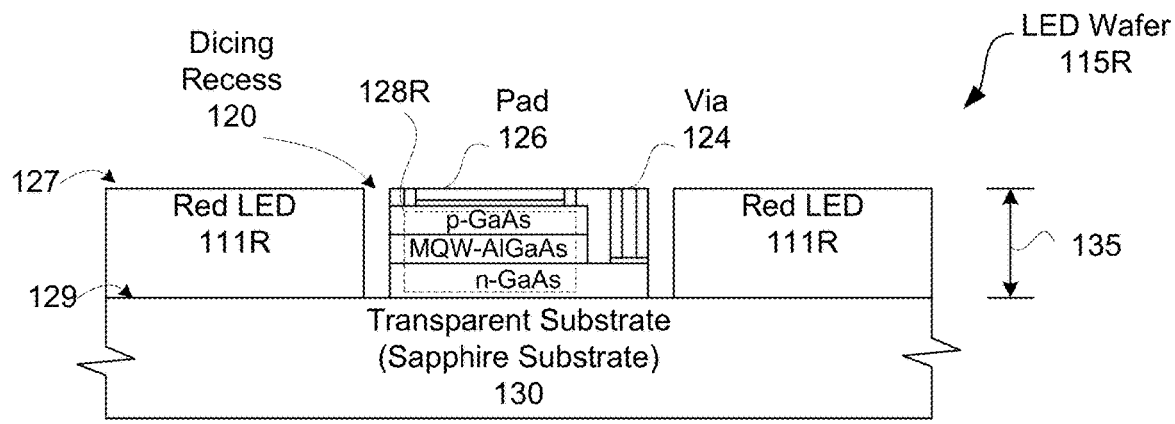

FIG. 4-1 is a block diagram of a cross-sectional view depicting an exemplary portion of an LED wafer 115B. LED wafer 115B includes blue μLEDs 111B formed on a lift-off transparent substrate 130. In this example, lift-off transparent substrate 130 is a sapphire substrate 130 for being transparent with respect to frequency of a laser, such as for example transparent with respect to laser light. However, in another lift-off application, another type of radiation, such as IR or UV, may be used for such lift-off, and thus another type of substrate transparent to such radiation may be used.

LEDs 111B may be separated from one another on transparent substrate 130 by dicing recesses 120 extending from upper surfaces 127 of blue μLEDs 111B down to an upper surface 129 of transparent substrate 130. These dicing recesses 120 may be cut with a plasma or other cutting tool. A reveal of a middle blue LED 111B is provided to indicate some details of formation thereof.

A blue LED 111B may generally have a stack 128B, such as of n-GaN, MQW-InGaN, and p-GaN layers for example. An anode or positive side, such as a p-GaN layer for example, of such stack 128B may have connected thereto an upper conductive pad 126 at an upper surface 127 of such blue LED 111B. Such conductive pad 126 may be directly connected or interconnected for electrical conductivity to such an anode layer of such stack 128B.

A conductive via 124 may extend from an upper surface 127 of such blue LED 111B down to a cathode or negative side, such as an n-GaN layer for example, of such stack 128B. Such conductive via 124 may be directly connected or interconnected to such a cathode layer of such a stack 128B for electrical conductivity. Conductive vias 124 may or may not be used in a flip-chip application. However, for DBI connections, conductive vias 124 are used.

Portions of upper surface 127 associated with conductive vias 124 and conductive pads 126 may be available for forming cathode and anode interconnect nodes 204 and 206, respectively, for interconnecting a green LED 111G to a driver circuit 103 and a supply voltage node 108.

FIG. 4-2 is a block diagram of a cross-sectional view depicting an exemplary portion of an LED wafer 115G. LED wafer 115G includes green μLEDs 111G formed on a lift-off transparent substrate 130. In this example, lift-off transparent substrate 130 is a sapphire substrate 130 for being transparent to laser light. However, in another lift-off application, another type of radiation may be used for such lift-off, and thus another type of substrate transparent to such radiation may be used.

LEDs 111G may be separated from one another on transparent substrate 130 by dicing recesses 120 extending from upper surfaces 127 of green μLEDs 111G down to an upper surface 129 of transparent substrate 130. A reveal of a middle green LED 111G is provided to indicate some details of formation thereof.

A green LED 111G may generally have a stack 128G, such as of n-GaP, MQW-InGaP, and p-GaP layers or n-GaP, MQW-InGaN, and p-GaP layers for example. An anode or positive side, such as a p-GaP layer for example, of such stack 128G may have connected thereto an upper conductive pad 126 at an upper surface 127 of such green LED 111G. Such conductive pad 126 may be directly connected or interconnected for electrical conductivity to such an anode layer of such stack 128G.

A conductive via 124 may extend from an upper surface 127 of such green LED 111G down to a cathode or negative side, such as an n-GaP layer for example, of such stack 128G. Such conductive via 124 may be directly connected or interconnected to such a cathode layer of such a stack 128G for electrical conductivity.

Portions of upper surface 127 associated with conductive vias 124 and conductive pads 126 may be available for forming cathode and anode interconnect nodes 204 and 206, respectively, for interconnecting a green LED 111G to a driver circuit 103 and a supply voltage node 108.

FIG. 4-3 is a block diagram of a cross-sectional view depicting an exemplary portion of an LED wafer 115R. LED wafer 115R includes red μLEDs 111R formed on a lift-off transparent substrate 130. In this example, lift-off transparent substrate 130 is a sapphire substrate 130 for being transparent to laser light. However, in another lift-off application, another type of radiation may be used for such lift-off, and thus another type of substrate transparent to such radiation may be used.

LEDs 111R may be separated from one another on transparent substrate 130 by dicing recesses 120 extending from upper surfaces 127 of red μLEDs 111R down to an upper surface 129 of transparent substrate 130. A reveal of a middle red LED 111R is provided to indicate some details of formation thereof.

A red LED 111R may generally have a stack 128R, such as of n-GaAs, MQW-AlGaAs or MQM-AlGaInP, and p-GaAs layers for example. An anode or positive side, such as a p-GaAs layer for example, of such stack 128R may have connected thereto an upper conductive pad 126 at an upper surface 127 of such red LED 111R. Such conductive pad 126 may be directly connected or interconnected for electrical conductivity to such an anode layer of such stack 128R.

A conductive via 124 may extend from an upper surface 127 of such red LED 111R down to a cathode or negative side, such as an n-GaAs layer for example, of such stack 128R. Such conductive via 124 may be directly connected or interconnected to such a cathode layer of such a stack 128R for electrical conductivity.

Portions of upper surface 127 associated with conductive vias 124 and conductive pads 126 may be available for forming cathode and anode interconnect nodes 204 and 206, respectively, for interconnecting a red LED 111R to a driver circuit 103 and a supply voltage node 108.

Figures 1, 5:
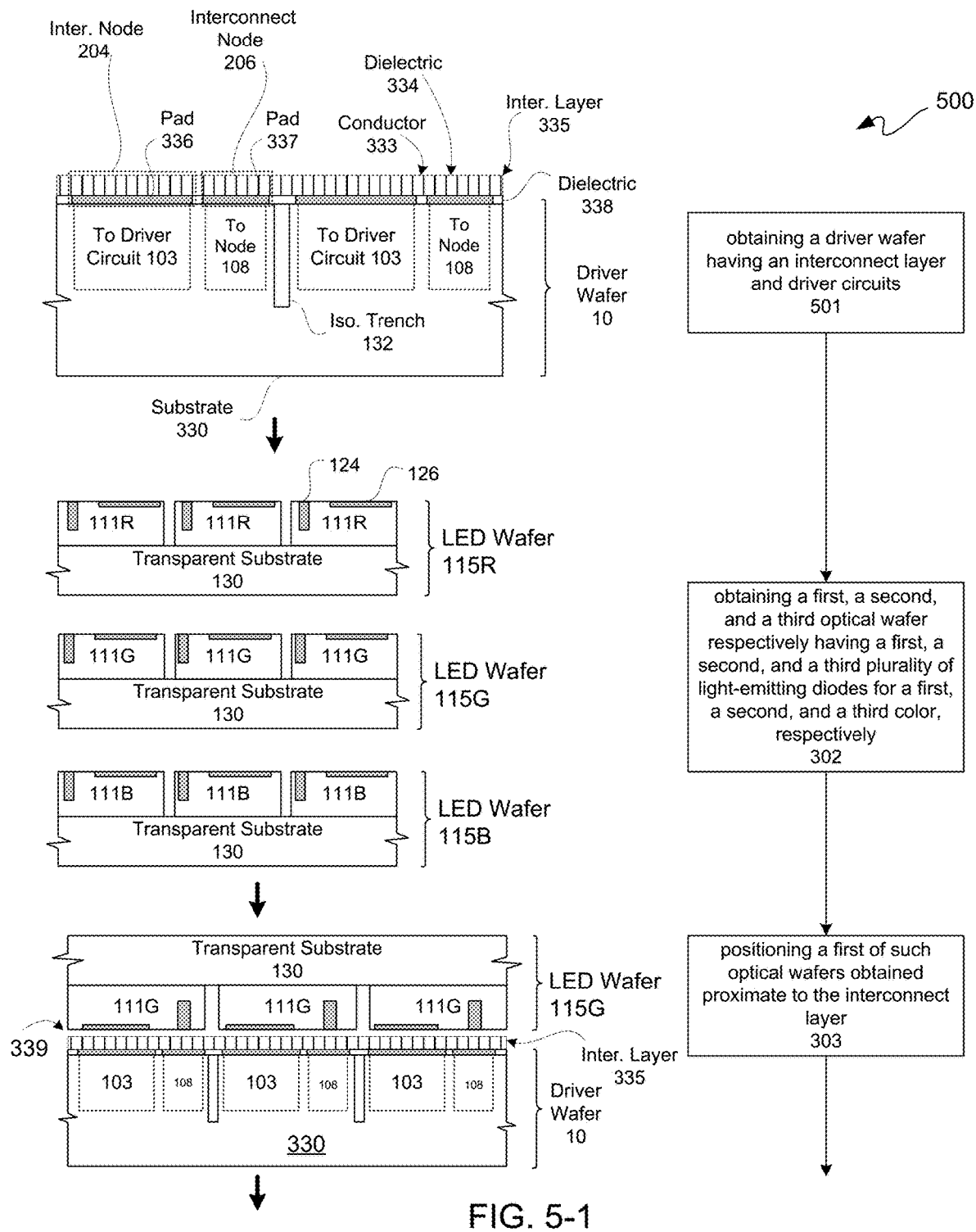
Figures 2, 5:
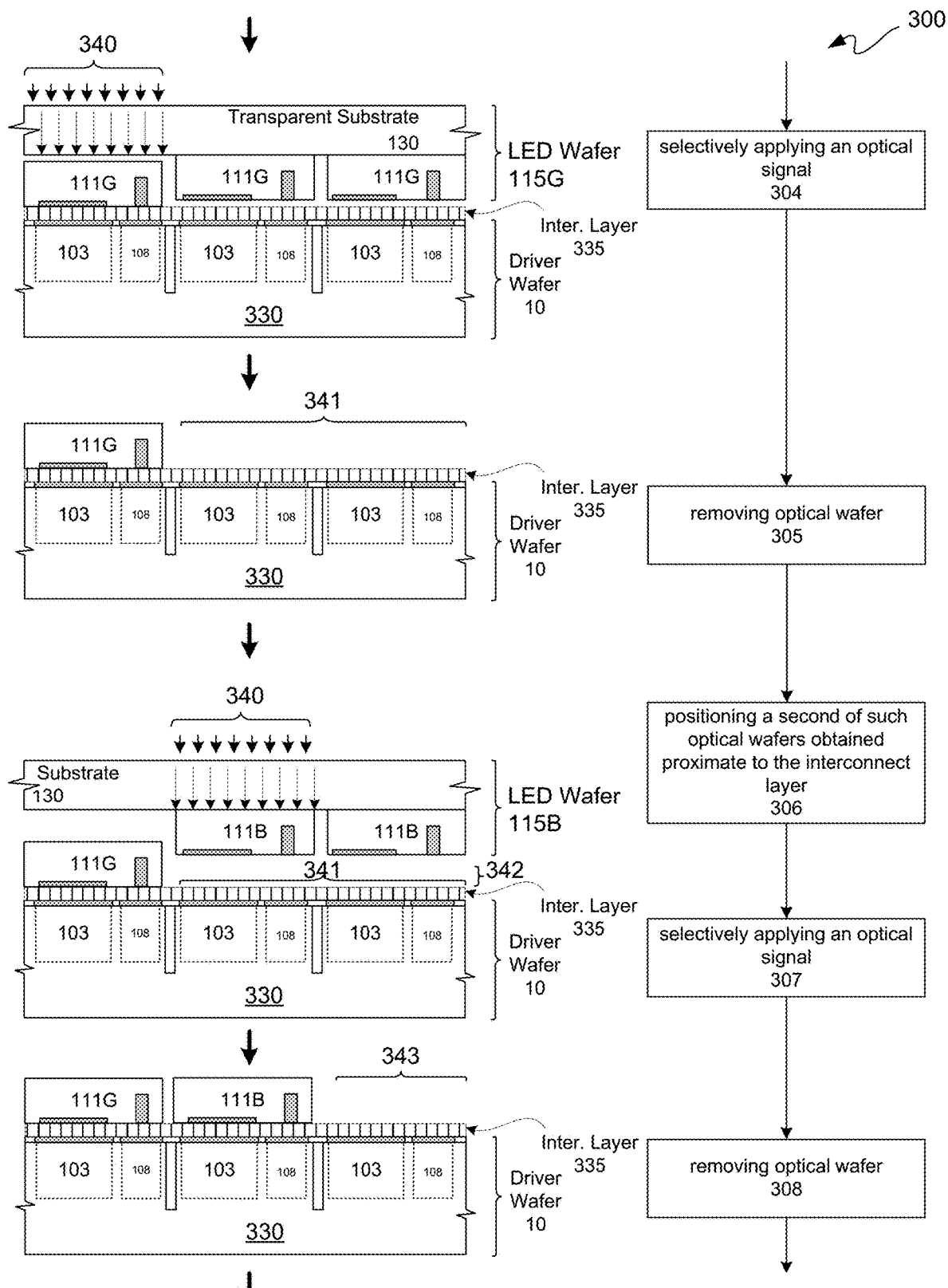
Figures 3, 5:
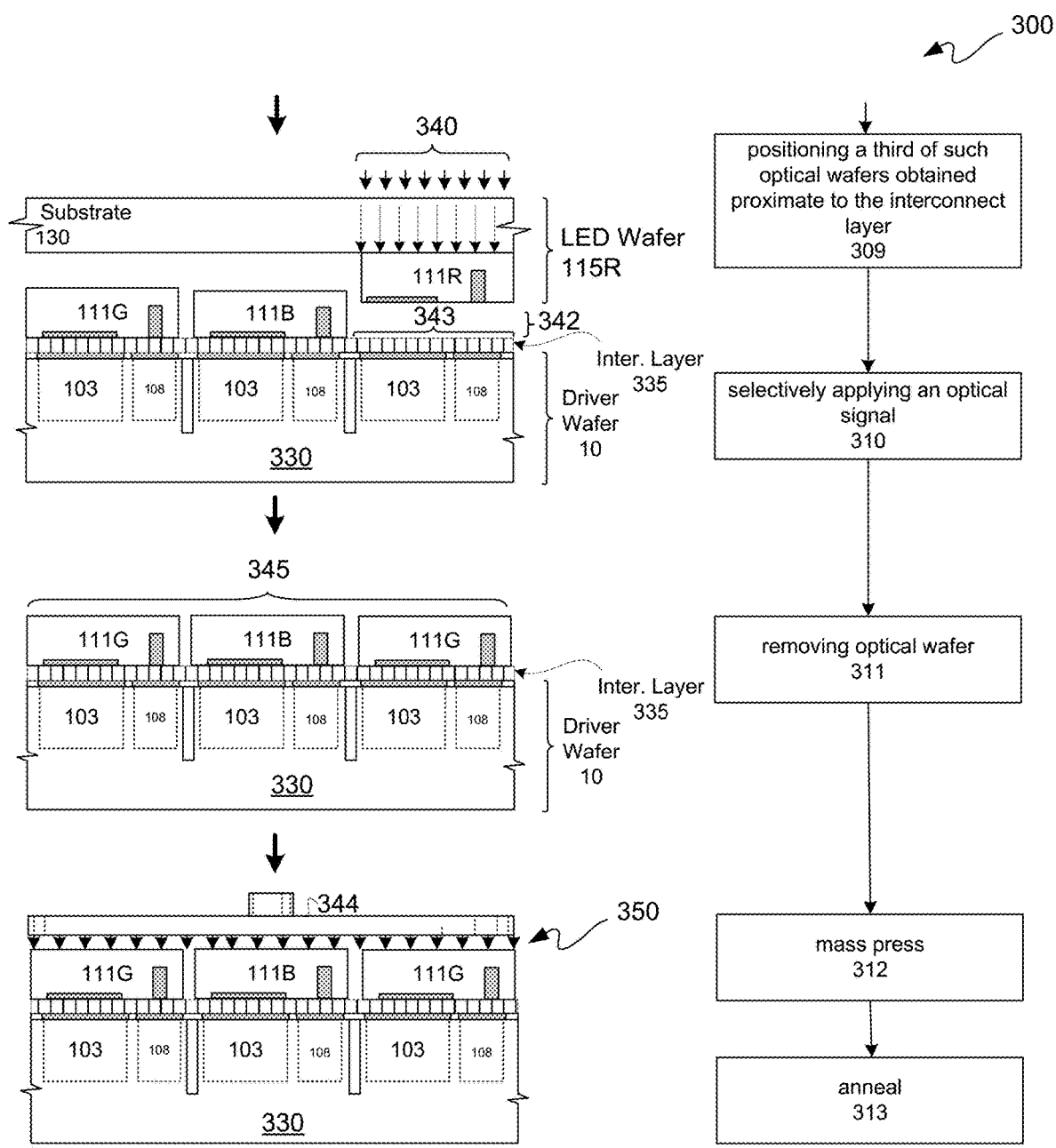

FIGS. 5-1 through 5-3 ("FIG. 5") is a block-flow diagram depicting an exemplary light-emitting diode display forming process ("display process") 300. At operation 301, a driver or carrier wafer 10 may be obtained. Such obtained driver wafer 10 may have an interconnect layer 335 and a plurality of driver circuits 103 and one or more supply voltage nodes 108 formed using a substrate 330, such as a silicon substrate 330, for a MOS driver circuit, such as NMOS, CMOS, or PMOS, for example.

Driver wafer 10 may include conductive pads 336 and 337 formed on an upper surface of substrate 330 in a dielectric layer 338. Dielectric layer 338 may be formed and patterned on such upper surface of substrate 330 for defining recesses therein for forming conductive pads 336 and 337.

Conductive pads 336 may be interconnected to interconnect nodes 204 of driver circuits 103. Conductive pads 337 may be interconnected to interconnect nodes 206 for one or more corresponding supply voltage nodes 108. Isolation, such as isolation trenches 132 with dielectric fill material therein, may be used to separate driver circuits 103 from one another within substrate 330. In this example, supply voltage nodes 108 are proximate to corresponding driver circuits 103 for interconnection of corresponding μLEDs 111.

An interconnect layer 335 may be formed over conductive pads 336 and 337, as well as over and on dielectric layer 338. Interconnect layer 335 may be an anisotropic conductive film ("ACF"), which is an adhesive interconnect system having dielectric portions 334, illustratively depicted as vertical blocks, interleaved with conductive portions 333, illustratively depicted as vertical lines.

Conductive pads 336 and corresponding portions of interconnect layer 335 may be at least a portion of corresponding interconnect nodes 104. Another portion of such interconnect nodes 104 may include corresponding conductive pads 126.

Conductive pads 337 and corresponding portions of interconnect layer 335 may be at least a portion of corresponding interconnect nodes 106. Another portion of such interconnect nodes 106 may include upper portions of corresponding conductive vias 124.

At operation 302, a first, a second, and a third optical wafer respectively having a first, a second, and a third plurality of LEDs for a first, a second, and a third color, respectively, may be obtained. In this example, LED wafers 115R, 115G, and 115B may be obtained. Furthermore, as generally two green LEDs are used for each red and blue LED in a pixel, optionally at operation 302, two green LED wafers 115G may be obtained along with one each of a blue LED wafer 111B and a red LED wafer 111R.

At operation 303, an optical wafer, such as a first optical wafer 115, obtained at operation 302 may be positioned proximate to interconnect layer 335 for having LEDs thereof facing or opposite a driver wafer 10 with respect to such interconnect layer 335. Along those lines, at operation 303, an obtained LED wafer of LED wafers 115R, 115G, and 115B may be inverted and positioned suspended above an upper surface of interconnect layer 335. A gap 339 may exist between an upper surface of interconnect layer 335 of driver wafer 10 and such inverted LED wafer of LED wafers 115R, 115G, and 115B.

In this position, μLEDs 111 of such LED wafer 115 may be aligned to corresponding circuitry in driver wafer 10. Pads 126 may be aligned to corresponding pads 336, and vias 124 may be aligned to corresponding pads 337. For this alignment, LED wafer 115 and driver wafer 10 may have index markings for alignment for a W2W assembly.

Gap 339 may be used to prevent μLEDs 111 of LED wafer 115 not used in this operation 303 from sticking to an adhering upper surface of interconnect layer 335, as described below in additional detail. In this example, a green LED wafer 115G with green μLEDs 111G is illustratively depicted; however, a first selected wafer may be any of LED wafers 115 obtained at operation 302. However, in another example, gap 339 may be omitted for a direct contact application.

At operation 304, an optical or other radiation beam 340 may be selectively applied to a bottom surface of transparent substrate 130, though in an inverted orientation so effectively an upper surface. In this example, optical beam 340 is a laser beam or beams ("laser beam"). In another example, a different form of radiation such as IR, UV or other selective "liftoff" radiation beam source may be used.

At operation 304, laser beam 340 may pass through a transparent substrate 130, with respect to such beam, of an optical wafer positioned at operation 303 to selectively release or sever at least one of a plurality of μLEDs 111 from such substrate 130 for contact with an upper surface of interconnect layer 335 for interconnection with a portion of an interconnect node, which may at this juncture be considered a portion of a corresponding driver circuit 103. A laser tool may be programmed for selective liftoff.

This is known as a selective laser "liftoff" operation, which may be used for this W2W application. For a sapphire substrate 130, optical alignment may be performed through such transparent substrate, which may be accurate within 0.25 microns.

Application of laser beam 340 through transparent substrate 130 to impinge upon a lower surface, though upper surface when inverted, of a μLED 111 coupled to transparent substrate 130 may be used to release such a μLED 111 from such substrate 130. Selective application of laser beam 340 may be used to release one or more μLEDs 111 from an LED wafer 115 to cause such selected μLEDs 111 to drop through gap 339, if present, onto an upper surface of interconnect layer 335 for an on-contact hold therewith. Along those lines, discrete μLEDs 111 may be release one at a time or in multiples at a time by application of one or more laser beams. The portion released from a transparent substrate or carrier 130 is an active portion of an optical wafer, namely discrete μLEDs 111. Even though discrete μLEDs 111 are described, another type of LED with a thickness 135 of less than 10 microns may be used.

Adhesive of ACF interconnect layer 335 at least temporarily holds such released one or more μLEDs 111 in place for subsequent processing. Unselected μLEDs 111 of an LED wafer 115 may be left attached to transparent substrate 130, namely are not exposed at this operation to laser beam 340 at least in a sufficient amount to cause release from substrate 130.

At operation 305, an optical wafer 115 processed at operation 304 may be removed leaving a driver wafer 10 with one or more μLEDs 111, namely formerly of an LED wafer 115, attached to an interconnect layer 335. Inclusion of one or more selected μLEDs 111 leaves spaces, such as space 341, for one or more other μLEDs 111. Assuming for purposes of clarity by way of example and not limitation, green μLEDs 111G are left attached to interconnect layer 335 after operation 304, then space 340 may be used for a red and a blue μLEDs 111, or other combination, of other μLEDs 111.

At operation 306, another optical wafer, such as a second optical wafer 115, of optical wafers obtained at operation 302 may be positioned proximate to interconnect layer 335. Along those lines, at operation 306, an obtained LED wafer of LED wafers 115R, 115G, and 115B may be inverted and positioned suspended above an upper surface of interconnect layer 335. This second optical wafer may be for a same or a different color than previously processed; however, generally a different color is used for successively processing RGB LED wafers. Along those lines for purposes of clarity by way of example and not limitation, it shall be assumed that a blue LED wafer 115B is obtained at operation 306 and that a green LED wafer 115G was obtained at operation 303 and processed at operation 304.

Multiple driver wafers 10 may be processed at a time with multiple LED wafers 115 of different colors in order to have different colors bonded or attached at same locations to different driver wafers 10 creating vacancies on such LED wafers 115, which may then be used for keying an LED wafer 115 to a driver wafer 10, as described below in additional detail. So though a slight gap 342 may exist between an upper surface of interconnect layer 335 of driver wafer 10 and such inverted LED wafer 115B, this gap 342 may be at least thinner than thickness of a previously attached PLED 111G of such LED wafer 115G previously processed. A slight gap 342, if used, may prevent μLEDs 111B of LED wafer 115B not used in a subsequent selective release operation 307 from sticking to an adhering upper surface of interconnect layer 335. However, in another example, gap 342 may be omitted for direct contact between lower surfaces of μLEDs 111B of such LED wafer 115B onto an upper surface of interconnect layer 335.

In this position, μLEDs 111B of such LED wafer 115B may be aligned to corresponding circuitry in driver wafer 10 in space 341. Pads 126 may be aligned to corresponding pads 336, and vias 124 may be aligned to corresponding pads 337. For this alignment, LED wafer 115B and driver wafer 10 may have index markings for alignment for a W2W assembly. Optionally or additionally, one or more μLEDs 111G already attached to interconnect layer 335 may be used as one or more alignment features.

At operation 307, a laser beam 340 in this example may be selectively applied to a bottom surface of transparent substrate 130, though in an inverted orientation so effectively an upper surface. Laser beam 340 may pass through a transparent substrate 130 of an optical wafer positioned at operation 306 to selectively release at least one of a plurality of μLEDs 111B from such substrate 130 for contact with an upper surface of interconnect layer 335 for interconnection with a portion of an interconnect node, which may at this juncture be considered a portion of a corresponding driver circuit 103.

Application of laser beam 340 through transparent substrate 130 to impinge upon a lower surface, though upper surface when inverted, of a μLED 111B coupled to transparent substrate 130 may be used to release such a μLED 111B from such substrate 130. Selective application of laser beam 340 may be used to release one or more μLEDs 111B from an LED wafer 115B to cause such selected μLEDs 111B to drop through gap 342, if present, onto an upper surface of interconnect layer 335 for an on-contact hold therewith.

Adhesive of ACF interconnect layer 335 at least temporarily holds such released one or more μLEDs 111B in place for subsequent processing. Unselected μLEDs 111B of an LED wafer 115B may be left attached to transparent substrate 130, namely are not exposed at this operation to laser beam 340 at least in a sufficient amount to cause release from substrate 130.

At operation 308, an optical wafer 115B processed at operation 304 may be removed leaving a driver wafer 10 with one or more μLEDs 111B and one or more μLEDs 111G, namely formerly of an LED wafer 115B and 115G, respectively, attached to an interconnect layer 335. Inclusion of one or more selected μLEDs 111B and 111G may leave spaces, such as space 343, for one or more other μLEDs 111. Assuming for purposes of clarity by way of example and not limitation, μLEDs 111G and 111B are left attached to interconnect layer 335 respectively after operations 304 and 307, then space 343 may be used for one or more red μLEDs 111R, or other combination of other μLEDs 111.

At operation 309, yet another optical wafer, such as a third optical wafer 115, of optical wafers obtained at operation 302 may be positioned proximate to interconnect layer 335. Along those lines, at operation 309, an obtained LED wafer of LED wafers 115R, 115G, and 115B may be inverted and positioned suspended above an upper surface of interconnect layer 335. This third optical wafer may be for a same or a different color than previously processed; however, generally a different color is used. Along those lines for purposes of clarity by way of example and not limitation, it shall be assumed that a red LED wafer 115R is obtained at operation 309 continuing the above example.

Again, by using multiple wafers of different colors of LED wafers 115 for different driver wafers 10 at a time, a slight or no gap 342 may exist between an upper surface of interconnect layer 335 of driver wafer 10 and such inverted LED wafer 115R. This gap 342, if present, may be at least thinner than thickness of a previously attached μLED 111 to such interconnect layer 335. Additionally, gap 342, if used, may prevent µLEDs 111R of LED wafer 115R not used in a subsequent selective release operation 310 from sticking to an adhering upper surface of interconnect layer 335. However, in another example, gap 342 may be omitted for direct contact between lower surfaces of µLEDs 111R of such LED wafer 115R onto an upper surface of interconnect layer 335.

In this position, µLEDs 111R of such LED wafer 115R may be aligned to corresponding circuitry in driver wafer 10 in space 343. Pads 126 may be aligned to corresponding pads 336, and vias 124 may be aligned to corresponding pads 337. For this alignment, LED wafer 115R and driver wafer 10 may have index markings for alignment for a W2W assembly. Optionally or additionally, one or more µLEDs 111 already attached to interconnect layer 335 may be used as one or more alignment features.

At operation 310, a laser beam 340 in this example may be selectively applied to a bottom surface of transparent substrate 130, though in an inverted orientation so effectively an upper surface. Laser beam 340 may pass through a transparent substrate 130 of an optical wafer 115R positioned at operation 309 to selectively release at least one of a plurality of µLEDs 111R from such substrate 130 for contact with an upper surface of interconnect layer 335 for interconnection with a portion of an interconnect node, which may at this juncture be considered a portion of a corresponding driver circuit 103.

Application of laser beam 340 through transparent substrate 130 to impinge upon a lower surface, though upper surface when inverted, of a µLED 111R coupled to transparent substrate 130 may be used to release such a µLED 111R from such substrate 130. Selective application of laser beam 340 may be used to release one or more µLEDs 111R from an LED wafer 115R to cause such selected µLEDs 111R to drop through gap 342, if present, onto an upper surface of interconnect layer 335 for an on-contact hold therewith.

Adhesive of ACF interconnect layer 335 at least temporarily holds such released one or more µLEDs 111R in place for subsequent processing. Unselected µLEDs 111B of an LED wafer 115B may be left attached to transparent substrate 130, namely are not exposed at this operation to laser beam 340 at least in a sufficient amount to cause release from substrate 130.

At operation 311, an optical wafer 115R processed at operation 310 may be removed leaving a driver wafer 10 with one or more µLEDs 111R, one or more µLEDs 111B, and one or more µLEDs 111G, namely respectively formerly of LED wafers, 115R, 115B and 115G, attached to an interconnect layer 335. Inclusion of selected µLEDs 111R, 111B and 111G may be used to form pixels, such as a pixel 345.

At operation 312, a mass press may be performed on an LED display assembly 350 having a driver wafer 10 with interconnect layer 335 having µLEDs 111 thereon. A compliant top plate 344 may be used for this press operation. Such mass press operation 312 may be performed to press an ACF interconnect layer 335 to more securely attached µLEDs 111 thereto. This mass press operation may be performed before or after all µLEDs 111 for an LED display assembly or assemblies 350 for a wafer-level processing are attached to interconnect layer 335.

Assuming all µLEDs 111 for an LED display assembly or assemblies 350 for a wafer-level processing are attached to interconnect layer 335, an anneal of such LED display assembly or assemblies 350 may be performed at operation 313. Because this display process 300 is performed at a wafer level, there may be one or more in-process display assemblies 350 for a wafer. Such anneal operation 313 may be used to provide electrical and mechanical interconnection of µLEDs 111 to corresponding driver circuits 103.

Figures 1, 6:
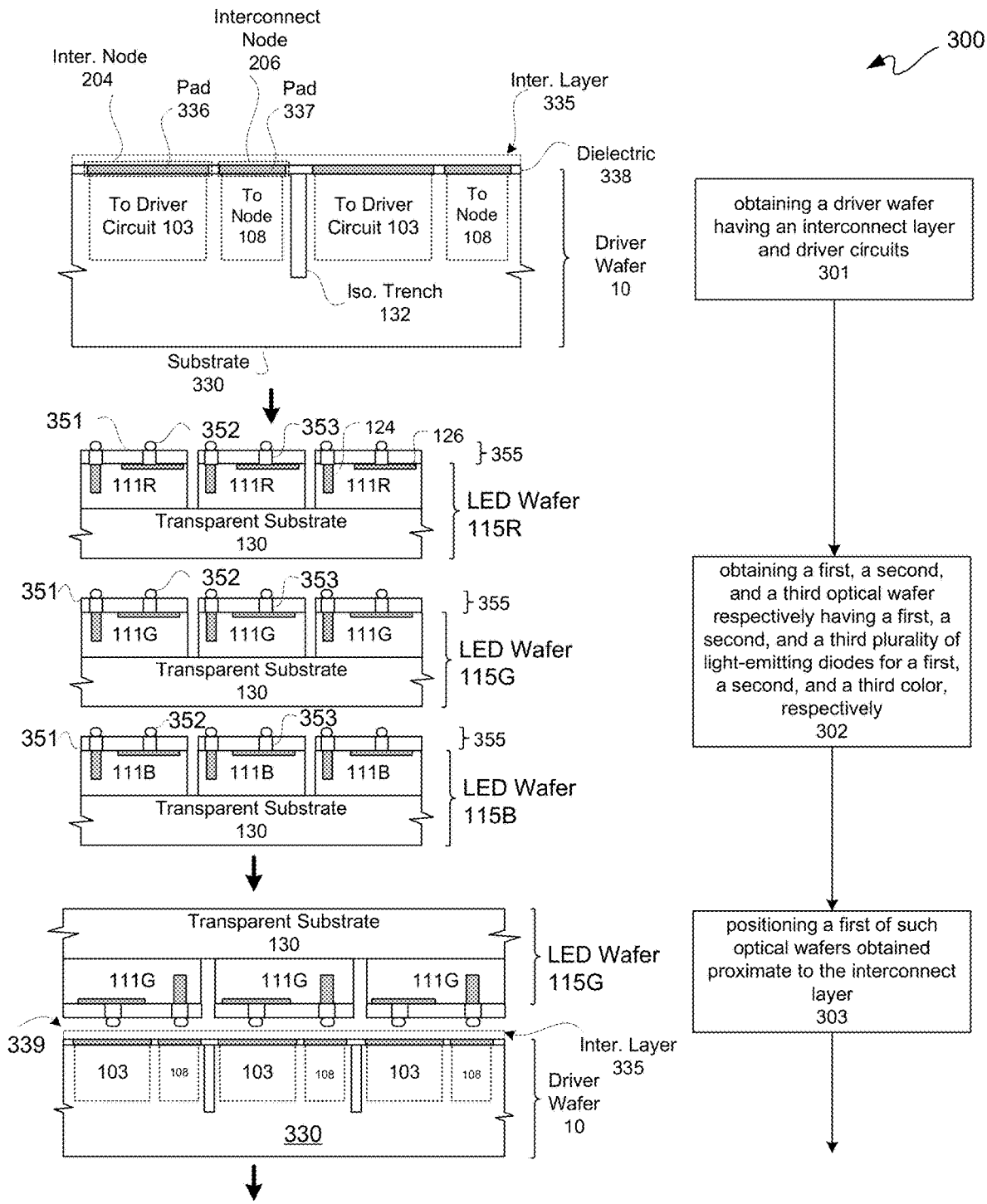
Figures 2, 6:
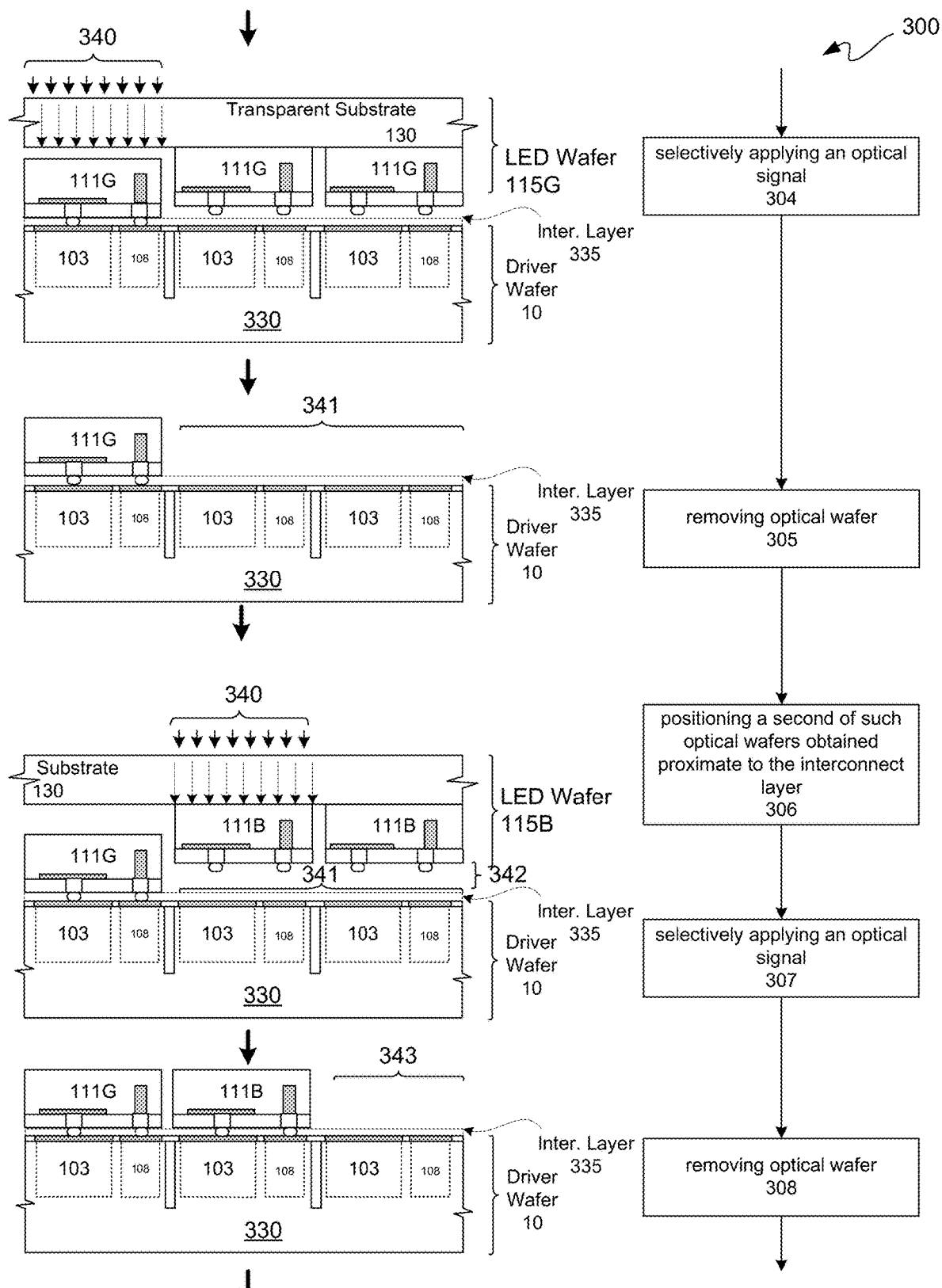
Figures 3, 6:
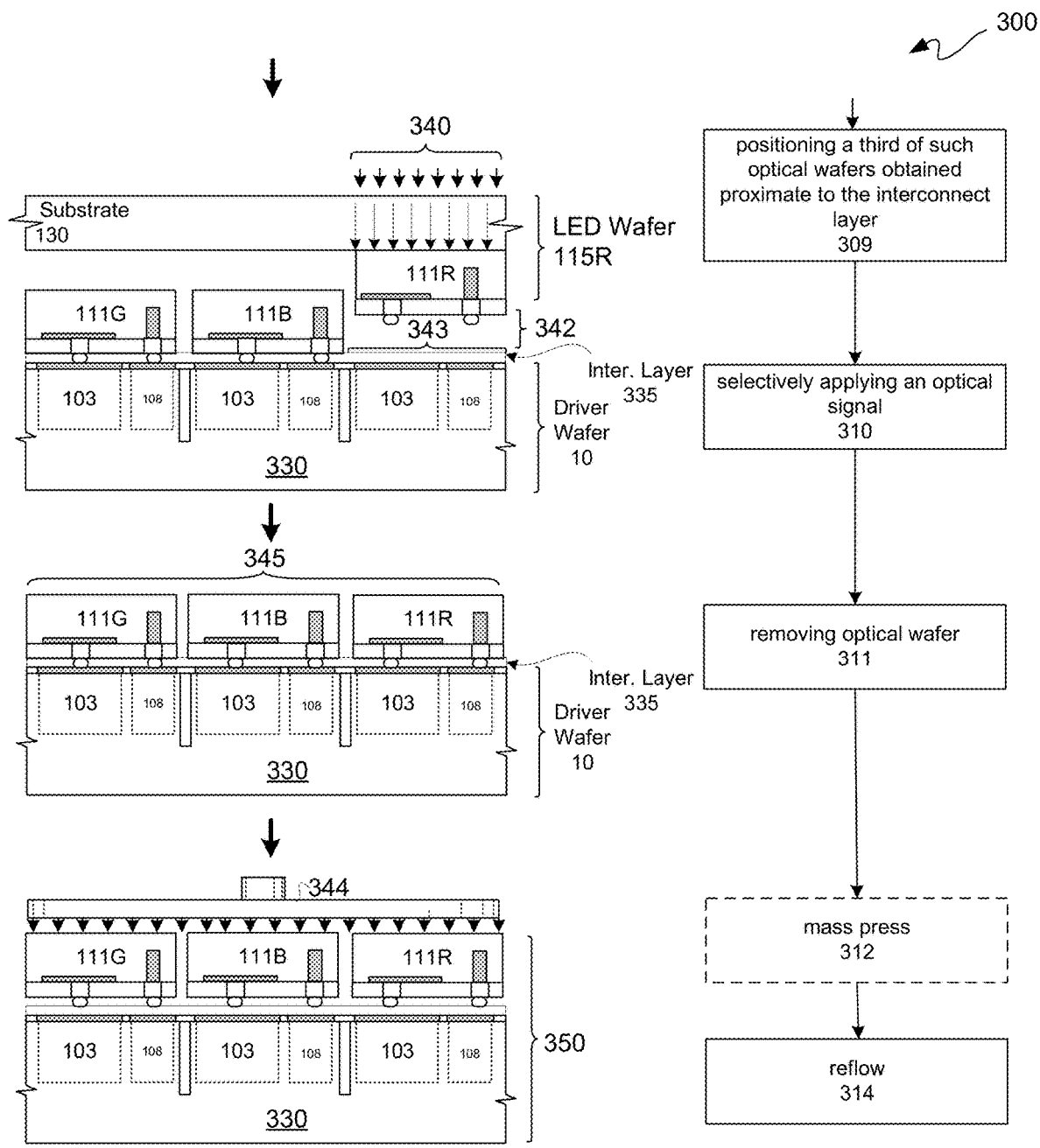

FIGS. 6-1 through 6-3 ("FIG. 6") is a block-flow diagram depicting another exemplary display process 300. Display processes 300 of FIGS. 5 and 6 are similar, and so many details are not repeated for purposes of clarity and not limitation.

At operation 301, a driver wafer 10 may be obtained, as previously described. An interconnect layer 335 may be formed over and on conductive pads 336 and 337, as well as over and on dielectric layer 338. Interconnect layer 335 may be a layer of flux, which can temporarily hold µLEDs 111 in place during processing. Such processing is the same as previously described and thus not repeated for purposes of clarity, except for the following differences.

Conductive pads 336 may be at least a portion of corresponding interconnect nodes 104. Another portion of such interconnect nodes 104 may include corresponding conductive pads 126.

Conductive pads 337 may be at least a portion of corresponding interconnect nodes 106. Another portion of such interconnect nodes 106 may include upper portions of corresponding conductive vias 124.

At operation 302, a first, a second, and a third optical wafer 115 respectively having a first, a second, and a third plurality of LEDs 111 for a first, a second, and a third color, respectively, may be obtained, as previously described. However, in this example, each of such optical wafers 115 include a dielectric passivation layer 351 having studs or contacts 353 formed therein. Contacts 353 may be respectively formed on pads 126 and vias 124 for electrical conductivity therewith. Eutectic masses 352 may be formed on contacts 353, such as solder balls, bumps or other solder masses. For purposes of clarity and not limitation, contacts 353, dielectric passivation layer 351, and eutectic masses 352 may collectively be considered an interconnect layer 355.

At operation 303, an optical wafer, such as a first optical wafer 115, obtained at operation 302 may be positioned proximate to interconnect layer 335. Along those lines, at operation 303, an obtained LED wafer of LED wafers 115R, 115G, and 115B may be inverted and positioned suspended above an upper surface of interconnect layer 335. A gap 339 may exist between an upper surface of interconnect layer 335 of driver wafer 10 and such inverted LED wafer of LED wafers 115R, 115G, and 115B. In this example, such gap 339 may be due to solder masses 353.

In this position, µLEDs 111 of such LED wafer 115 may be aligned to corresponding circuitry in driver wafer 10. Pads 126 and solder masses 353 attached thereto may be aligned to corresponding pads 336, and vias 124 and solder masses 353 attached thereto may be aligned to corresponding pads 337. For this alignment, LED wafer 115 and driver wafer 10 may have index markings for alignment for a W2W assembly.

Gap 339 may additionally be used to prevent µLEDs 111 of LED wafer 115 not used in this operation 303 from exposure to interconnect layer 335. In this example, a green LED wafer 115G with green µLEDs 111G is illustratively depicted; however, a first selected wafer may be any of LED wafers 115 obtained at operation 302.

At operation 304, a laser beam 340 may be selectively applied to a bottom surface of transparent substrate 130, though in an inverted orientation so effectively an upper surface. For laser beam 340 liftoff, temperature due to a laser beam 340 may be less than 100 degrees Celsius at a die surface, which will not impact solder masses 353.

At operation 304, laser beam 340 may pass through a transparent substrate 130 of an optical wafer positioned at operation 303 to selectively release at least one of a plurality of μLEDs 111 from such substrate 130 for contact with an upper surface of interconnect layer 335 and for sinking down through interconnect layer 335 for having solder masses 353 rest on corresponding pads 336 and 337. Solder masses 353 may be for interconnection with a portion of an interconnect node, which may at this juncture be considered a portion of a corresponding driver circuit 103. Selective application of laser beam 340 may be used to release one or more μLEDs 111 from an LED wafer 115 to cause such selected μLEDs 111 to drop through gap 339, if present, onto an upper surface of interconnect layer 335 for sinking down through a flux interconnect layer 335 for a temporary hold therewith. Flux of interconnect layer 335 at least temporarily holds such released one or more μLEDs 111 in place for subsequent processing.

At operation 305, an optical wafer 115 processed at operation 304 may be removed leaving a driver wafer 10 with one or more μLEDs 111, namely formerly of an LED wafer 115, temporarily held to an interconnect layer 335. Inclusion of one or more selected μLEDs 111 leaves spaces, such as space 341, for one or more other μLEDs 111. Assuming for purposes of clarity by way of example and not limitation, green μLEDs 111G are left attached to interconnect layer 335 after operation 304, then space 340 may be used for a red and a blue μLEDs 111, or other combination, of other μLEDs 111.

At operation 306, another optical wafer, such as a second optical wafer 115, of optical wafers obtained at operation 302 may be positioned proximate to interconnect layer 335. Along those lines, at operation 306, an obtained LED wafer of LED wafers 115R, 115G, and 115B may be inverted and positioned suspended above an upper surface of interconnect layer 335. This second optical wafer may be for a same or a different color than previously processed; however, generally a different color is used. Along those lines for purposes of clarity by way of example and not limitation, it shall be assumed that a blue LED wafer 115B is obtained at operation 306 and that a green LED wafer 115G was obtained at operation 303 and processed at operation 304.

Again, by using multiple wafers of different colors of LED wafers 115 for different driver wafers 10 at a time, a slight or no gap 342 may exist between an upper surface of interconnect layer 335 of driver wafer 10 and such inverted LED wafer 115R. A slight gap 342 may exist between an upper surface of interconnect layer 335 of driver wafer 10 and such inverted LED wafer 115B. This gap 342 may generally be at least thinner than thickness of a previously attached μLED 111G, including a passivation layer, of such LED wafer 115G previously processed. Additionally, gap 342, if used, may prevent μLEDs 111B of LED wafer 115B not used in a subsequent selective release operation 307 from sticking to an adhering upper surface of interconnect layer 335. However, in another example, gap 342 may be omitted for direct contact between lower surfaces of μLEDs 111R of such LED wafer 115R onto an upper surface of interconnect layer 335.

In this position, μLEDs 111B of such LED wafer 115B may be aligned to corresponding circuitry in driver wafer 10 in space 341. Pads 126 and corresponding solder masses 353 may be aligned to corresponding pads 336, and vias 124 and corresponding solder masses 353 may be aligned to corresponding pads 337.

At operation 307, a laser beam 340 in this example may be selectively applied to a bottom surface of transparent substrate 130, though in an inverted orientation so effectively an upper surface. Laser beam 340 may pass through a transparent substrate 130 of an optical wafer positioned at operation 306 to selectively release at least one of a plurality of μLEDs 111B from such substrate 130. Such released μLEDs 111B may drop through gap 342, if present, such released μLEDs 111B may make contact with an upper surface of interconnect layer 335, for having such solder masses 353 sink through interconnect layer 335 to rest on corresponding pads 336 and 337 for interconnection with respective portions of interconnect nodes, which may at this juncture be considered portions of a corresponding driver circuit 103.

Application of laser beam 340 through transparent substrate 130 to impinge upon a lower surface, though upper surface when inverted, of a μLED 111B coupled to transparent substrate 130 may be used to release such a μLED 111B from such substrate 130. Selective application of laser beam 340 may be used to release one or more μLEDs 111B from an LED wafer 115B to cause such selected μLEDs 111B to drop through gap 342, if present, onto an upper surface of interconnect layer 335 for having solder masses 353 sink to rest on corresponding upper surfaces of pads 336 and 337 for a temporary restraint from movement by flux interconnect layer 335. Flux of interconnect layer 335 at least temporarily holds such released one or more μLEDs 111B in place for subsequent processing.

At operation 308, an optical wafer 115B processed at operation 304 may be removed leaving a driver wafer 10 with one or more μLEDs 111B and one or more μLEDs 111G, namely formerly of an LED wafer 115B and 115G, respectively, restrained by an interconnect layer 335, as previously described. At operation 309, yet another optical wafer, such as a third optical wafer 115, of optical wafers obtained at operation 302 may be positioned proximate to interconnect layer 335, as previously described. A gap 342, if used, may exist between an upper surface of interconnect layer 335 of driver wafer 10 and such inverted LED wafer 115R.

In this position, μLEDs 111R of such LED wafer 115R may be aligned to corresponding circuitry in driver wafer 10 in space 343. Pads 126 and corresponding attached solder masses 353 may be aligned to corresponding pads 336, and vias 124 and corresponding attached solder masses 353 may be aligned to corresponding pads 337.

At operation 310, a laser beam 340 in this example may be selectively applied to a bottom surface of transparent substrate 130, though in an inverted orientation so effectively an upper surface. Laser beam 340 may pass through a transparent substrate 130 of an optical wafer 115R positioned at operation 309 to selectively release at least one of a plurality of μLEDs 111R from such substrate 130. Such released μLEDs 111R may drop through gap 342, if present, and such released μLEDs 111R may make contact with an upper surface of interconnect layer 335, for having such solder masses 353 sink through interconnect layer 335 to rest on corresponding pads 336 and 337 for interconnection with respective portions of interconnect nodes, which may at this juncture be considered portions of a corresponding driver circuit 103.

Selective application of laser beam 340 may be used to release one or more μLEDs 111R from an LED wafer 115R to cause such selected μLEDs 111R to drop through gap 342, if present, onto an upper surface of interconnect layer 335 for having solder masses 353 sink to rest on corresponding upper surfaces of pads 336 and 337 for a temporary restraint from movement by flux interconnect layer 335. Flux of interconnect layer 335 at least temporarily holds such released one or more μLEDs 111R in place for subsequent processing.

Flux of interconnect layer 335 at least temporarily hold such released one or more μLEDs 111R in place for subsequent processing. At operation 311, an optical wafer 115R processed at operation 310 may be removed leaving a driver wafer 10 with one or more μLEDs 111R, one or more μLEDs 111B, and one or more μLEDs 111G, namely respectively formerly of LED wafers, 115R, 115B and 115G, restrained by an interconnect layer 335. Inclusion of selected μLEDs 111R, 111B and 111G may be used to form pixels, such as a pixel 345.

At operation 312, a mass press may optionally be performed on an LED display assembly 350 having driver wafer 10 with interconnect layer 335 having μLEDs 111 thereon. Such mass press operation 312 may be performed to press μLEDs 111 through interconnect layer 335 to ensure contact between solder masses 353 and pads 336 and 337. This mass press operation may be performed before or after all μLEDs 111 for an LED display assembly or assemblies 350 for a wafer-level processing are attached to interconnect layer 335. Assuming all μLEDs 111 for an LED display assembly or assemblies 350 for a wafer-level processing are attached to interconnect layer 335, a reflow of such LED display assembly or assemblies 350 may be performed at operation 314. Such reflow operation 314 may be used to provide electrical and mechanical interconnection of μLEDs 111 to corresponding driver circuits 103.

FIG. 7 is a top down block diagram of a plan view depicting an exemplary LED display assembly 350 having pixels 345. Each pixel 345 has two μLEDs 111G, one μLED 111B, and one μLED 111R. However, this configuration or another configuration of colors may be used.

A height 356 and a length 357 of each of μLEDs 111 of LED display assembly 350 may not be greater than 5 microns a side. Along those lines, assuming μLEDs 111 of LED display assembly 350 abut one another, a largest pitch of adjacent ones of such μLEDs 111 of LED display assembly 350 attached to a driver wafer 10 may not be greater than 5 microns. However, even with a gap between neighboring μLEDs 111 of LED display assembly 350 for a high resolution small LED display assembly 350, a maximum horizontal pitch 358 may be at most 5 microns, and a maximum vertical pitch 359 may likewise be at most 5 microns.

Figures 1, 8:
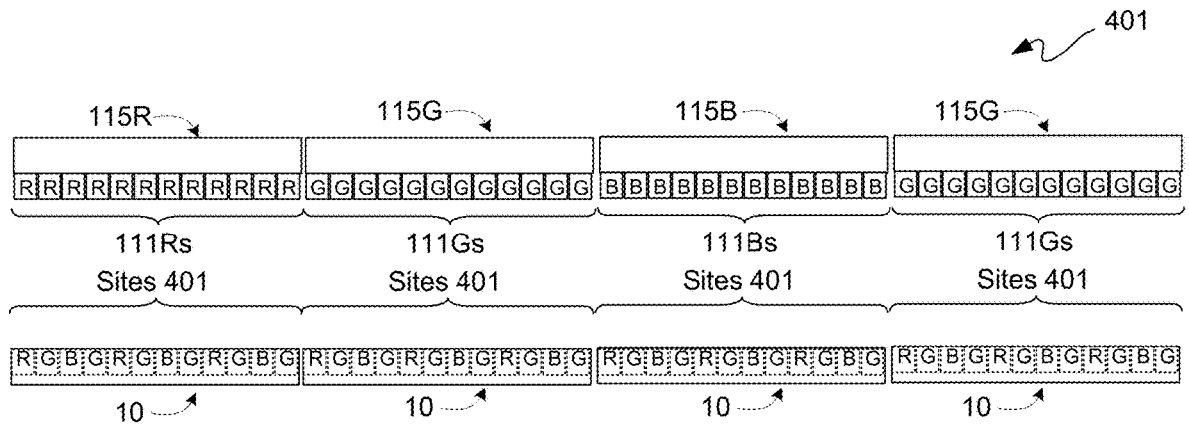
Figures 2, 8:
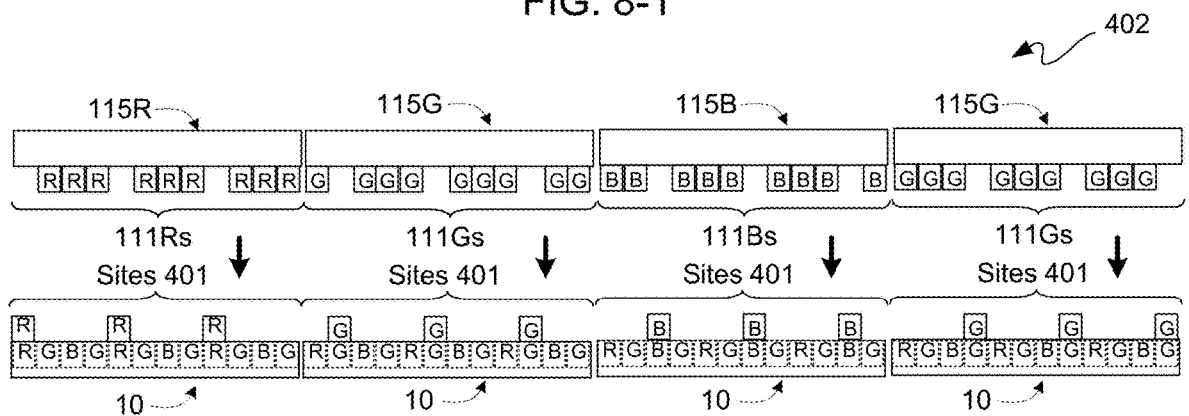
Figures 3, 8:
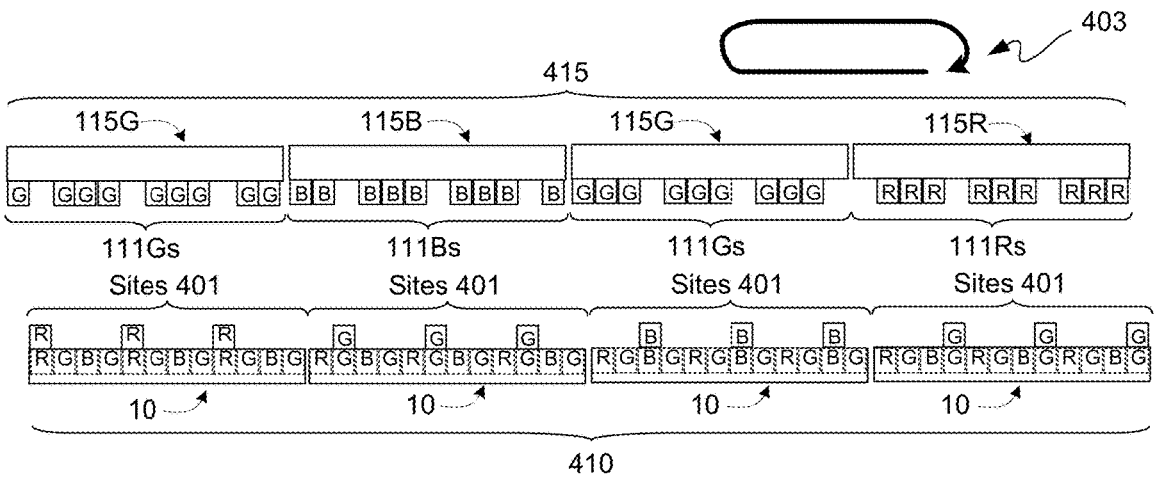
Figures 4, 8:
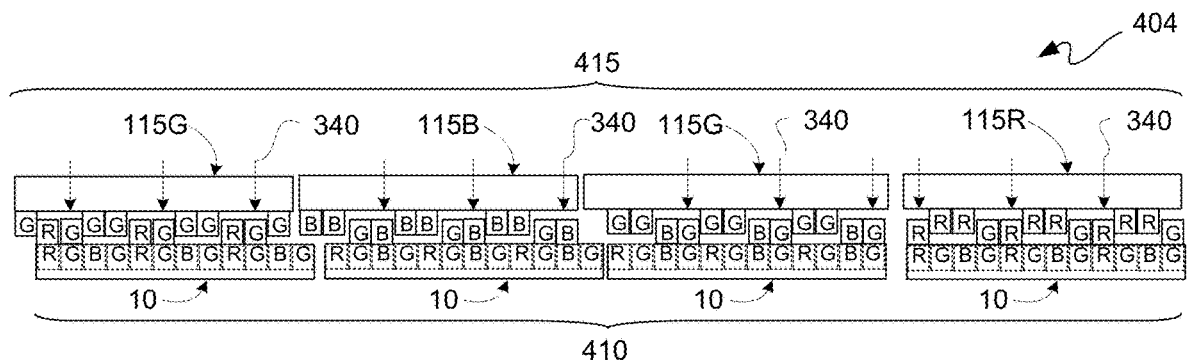
Figures 5, 8:
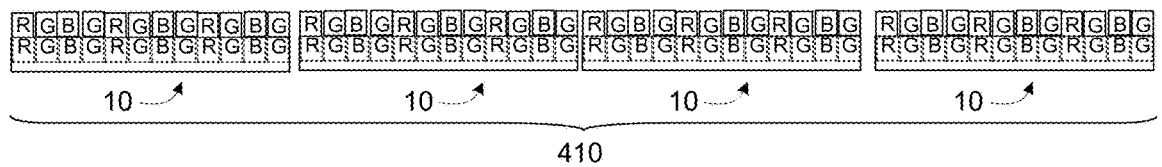

FIG. 8-1 is a block diagram depicting an exemplary W2W pairing of wafers 115. In this example, four driver wafers 10 are paired with four color LED wafers 115, namely 115R, 115G, 115B, and 115G in sequence. Locations or sites 401 for RGBG LEDs for connection with corresponding driver circuits 103 in driver wafers 10 are denoted with dashed boxes with either an R, G, or B. μLEDs 111R, 111G, 111B, and 111G respectively of LED wafers 115R, 115G, 115B, and 115G are positioned with respect to sites 401 for liftoff, as previously described.

FIG. 8-2 is the block diagram of FIG. 8-1 depicting an exemplary W2W pairing of LED wafers 115 after a liftoff operation 402. Because no sites 401 were previously occupied, facing surfaces of sites 401 and corresponding μLEDs 111 may come into contact or near contact with one another.

For R sites 401 of a leftmost driver wafer 10, all such R sites may be filled by μLEDs 111R of a correspondingly positioned LED wafer 115R. For G sites 401 of a left-middle driver wafer 10, all such G sites in an R-G-B sequence may be filled by μLEDs 111G of a correspondingly positioned LED wafer 115G. For B sites 401 of a right-middle driver wafer 10, all such B sites may be filled by μLEDs 111B of a correspondingly positioned LED wafer 115B. Lastly, for G sites 401 of a rightmost driver wafer 10, all such G sites in a B-G-R sequence may be filled by μLEDs 111G of a correspondingly positioned LED wafer 115G.

FIG. 8-3 is the block diagram of FIG. 8-2 depicting an exemplary W2W pairing of sets of wafers ("wafers") 410 and 415 after a liftoff operation 402 and after a positioning operation 403, and FIG. 8-4 is the block diagram of FIG. 8-3 depicting an exemplary W2W pairing and keying of wafers 410 and 415 for a selective liftoff operation 404. Positioning 403 of a set of LED wafers 415 of LED wafers 115R, 115G, 115B, and 115G with respect to a set of driver wafers 410, namely four driver wafers 10 in this example, may include re-orienting either or both one or more of such driver wafers 410 and/or one or more of such LED wafers 415 with respect to one another to key such wafer pairs one to another.

In this example, LED wafers 115R, 115G, 115B, and 115G are rotated with LED wafer 115R going from a leftmost to a rightmost position to provide a sequence of LED wafers 115G, 115B, 115G, and 115R. In other example, driver wafers 410 may be rotated with respect to LED wafers 415, or both sets of wafers 410 and 415 may be moved with respect to one another. In another example, this sequence of LED wafers 115G, 115B, 115G, and 115R may represent a lateral shift of either or both LED wafers 415 or driver wafers 410 with respect to one another.

In this example, a leftmost LED wafer 115G is positioned across from and offset with respect to a driver wafer 410 for keying between μLEDs 111G and 111R, respectively, of such wafers. A left-middle LED wafer 115B is positioned across from and offset with respect to a driver wafer 410 for keying between μLEDs 111B and 111G, respectively, of such wafers. A right-middle LED wafer 115G is positioned across from and offset with respect to a driver wafer 410 for keying between μLEDs 111G and 111B, respectively, of such wafers. Lastly, in this example, a rightmost LED wafer 115R is positioned across from and offset with respect to a driver wafer 410 for keying between μLEDs 111R and 111G, respectively, of such wafers.

This keying allows for surfaces of μLEDs 111 of LED wafers 415 to come in contact with or near an upper surface associated with corresponding sites 401. Along those lines, at least a substantial portion of μLEDs 111 of LED wafers 415 may be position below uppermost surfaces of μLEDs 111 on driver wafers 410, as illustratively depicted in the selective liftoff operation 404 of FIG. 8-4.

Operations 403 and 404 may repeated, though for progressively fewer μLEDs 111 on LED wafers 415, until driver wafers 410 are completely populated with μLEDs, as illustratively depicted in FIG. 8-5. Thus, μLEDs 111 from LED wafers 415 of different colors may be selectively and progressively placed onto driver wafers 410 to form pixels 345 of an LED display assembly 350, and subsequently bonded to such driver wafers 10 as previously described with an anneal or a reflow operation.

Even though FIGS. 8-1 through 8-5 are from a side view, it should be understood that such rotation may include rotating a planar wafer 90 degrees. This may be used to index, for example an uppermost and leftmost, LED color location of a driver wafer to match that of an associated LED wafer for selective application of LEDs to such driver wafer. After such selective application, columns may be completed using a next color, namely indexing to a leftmost and a second to uppermost LED location. This rotation of pairs of wafers may likewise be used to have LED and driver wafers capable of being keyed with respect to one another.

Figures 1, 2, 9:
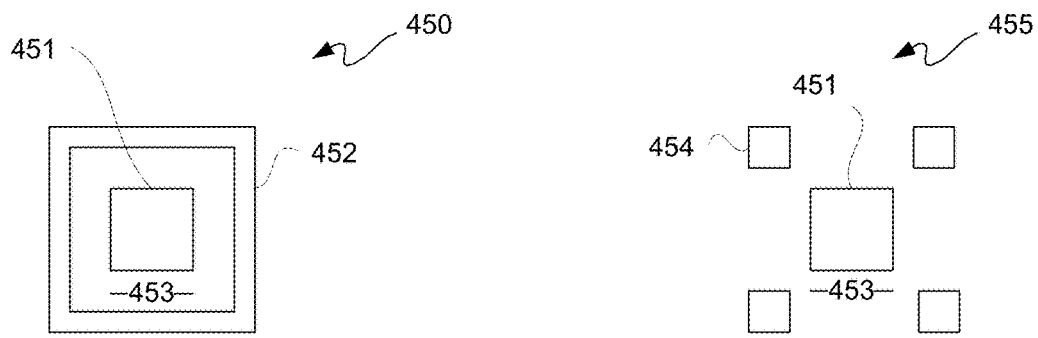

FIG. 9-1 is a plan view depicting an exemplary LED patterned contact 450, such as for an LED on an LED die or LED wafer. LED patterned contact 450 may include a generally centrally located pad 451, such as for an anode or p-contact of an PLED 111, with a ring 452 disposed around and offset from such pad 451 by a dielectric 453, including without limitation a dielectric layer or an air gap. Ring 452 may be for a cathode or n-contact of an LED 111.

FIG. 9-2 is a plan view depicting an exemplary LED patterned contact 455, such as for an LED on an LED die or LED wafer. LED patterned contact 455 may include a generally centrally located pad 451, such as for an anode or p-contact of an µLED 111, with four pads 454 disposed around and offset from such pad 451 by a dielectric 453, including without limitation a dielectric layer or an air gap. Such four pads 454 may generally form a ring-like perimeter and may be for a cathode or n-contact of a µLED 111.

LED patterned contacts 450 and 455 may be formed on LED wafers 115 with µLEDs 111. Such LED patterned contacts 450 and 455 are examples of symmetrical contacts that may be used to provide "bumped" locations on an LED die of an LED wafer.

Figures 1, 10:
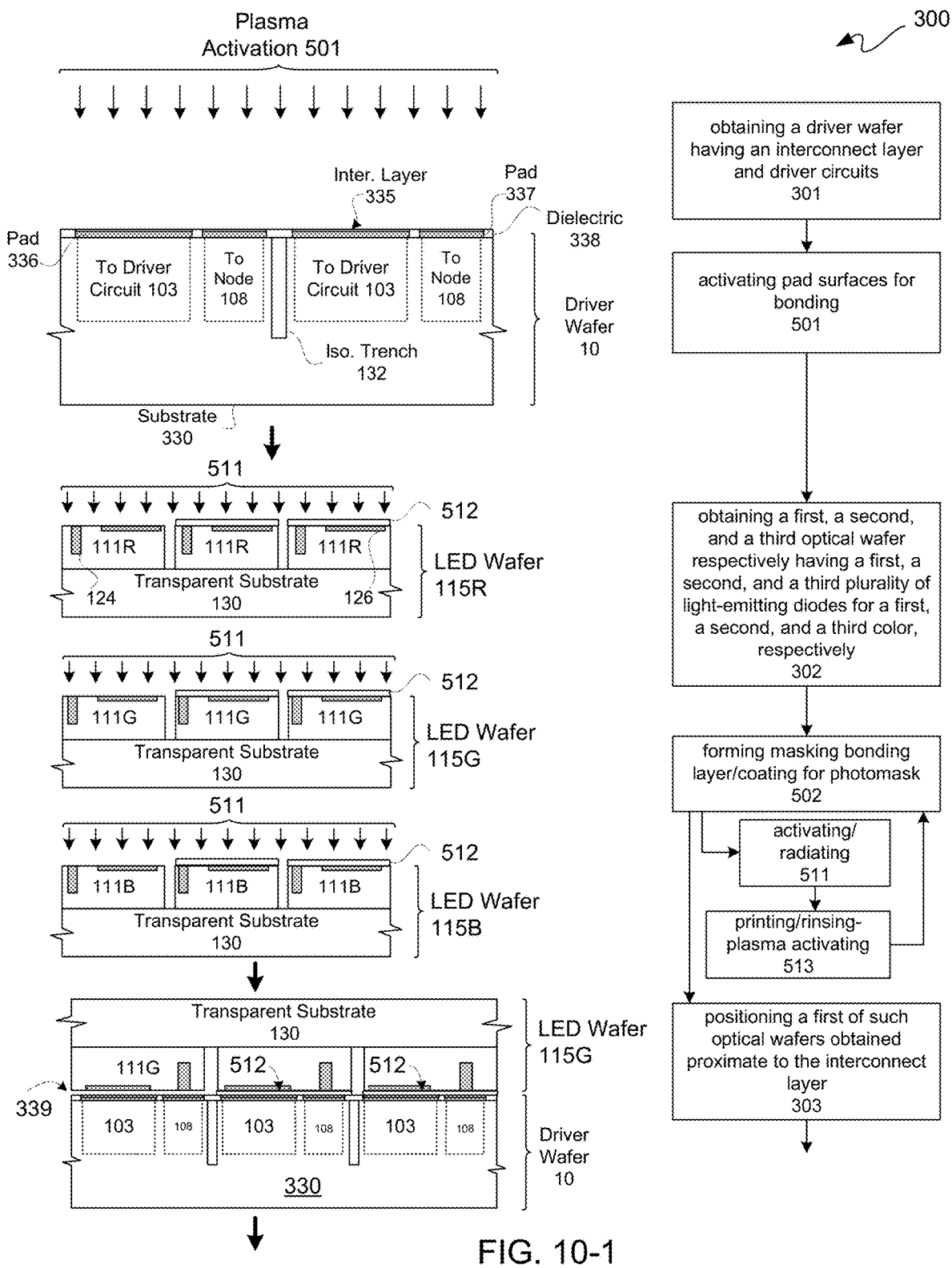
Figures 2, 10:
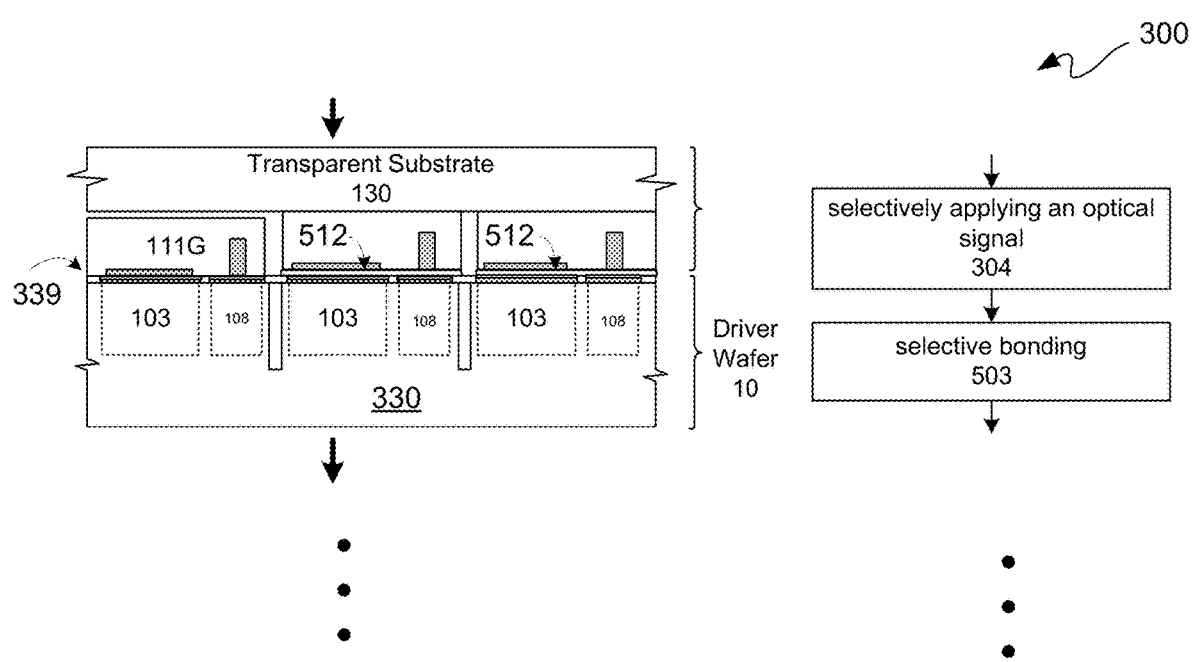

FIGS. 10-1 and 10-2 ("FIG. 10") is a block-flow diagram depicting another exemplary display process 300. As display process 300 of FIGS. 5 and 10 are similar, generally only the differences are described below for purposes of clarity. After operation 301, a plasma activation operation 501 may be performed for activating exposed upper surfaces of pads 336 and 337 with a plasma, such as a nitrogen-plasma for example, to form an interconnect layer or surface layer 335. This activation may be used for activating such surfaces for selective bonding, including without limitation DBI, as described below in additional detail.

After operations 302, a masking bonding layer 512, or a photomask 512 as described below, may be formed at operation 502 on upper surfaces of selected µLEDs 111 of LED wafers 115. Such masking bonding layer 512 may be formed by application of a plasma activation 511 on upper surfaces of µLEDs 111 of LED wafers 115. After plasma activation 511 of such surfaces, a micro-contact printing 513 of a self-assembled monolayer onto nitrogen-plasma activated surfaces may be performed to form masking bonding layer 512.

Optionally, rather than micro-contact printing 513, surfaces may be coated with a self-assembled monolayer at operation 502 for patterning with a photomask 512. Such coating at operation 502 may be followed by application of UV radiation at 511 through openings in photomask 512 to selectively dissociate portions of such coating. Rinsing at 513 may be performed to remove dissociated self-assembled monolayer portions, and further at operation 513, a plasma activation may be performed on unmasked portions.

Assuming nitrogen termination on nitrogen-plasma activated surfaces to be selectively bonded in a subsequent operation, a positioning operation 303 may be performed, as previously described, though where a masking bonding layer 512 may create a gap 339. A selective application of an optical signal operation 304 may be performed to release a selected µLED 111, such as for example a µLED 111G.

A selective bonding operation 503 may be performed, such as for a metal-to-metal bonding, such as for example metal-to-metal bond (Cu—Cu, Ni—Ni, Au—Au). In another example, bonding can be solder, eutectic bond (Al—Ge, Au—Sn, Au—Ge), ACF, or direct bonding interconnect ("DBI").

Operations for masking, activating, and selectively bonding as described above may be repeated in accordance with the above descriptions of operations, for forming an LED display assembly 350. Along those lines, portions of masking layer 512 may be selectively removed, or may be removed entirely followed by reformation as previously described.

While the foregoing describes exemplary embodiment(s) in accordance with one or more aspects of the disclosure, other and further embodiment(s) in accordance with the one or more aspects of the disclosure may be devised without departing from the scope thereof, which is determined by the claim(s) that follow and equivalents thereof. Each claim of this document constitutes a separate embodiment, and embodiments that combine different claims and/or different embodiments are within the scope of the disclosure and will be apparent to those of ordinary skill in the art after reviewing this disclosure. Claim(s) listing steps do not imply any order of the steps. Trademarks are the property of their respective owners.

What is claimed is:

1. A light-emitting diode display, comprising:
a driver die having a plurality of driver circuits;
each of the plurality of driver circuits having a first wafer-to-wafer interconnect node;
each of the plurality of driver circuits associated with a voltage supply node as a second wafer-to-wafer interconnect node;
a plurality of discrete light-emitting diodes each diode having a thickness of 10 microns or less and respectively interconnected to the plurality of driver circuits between a corresponding one of the first wafer-to-wafer interconnect node and the second wafer-to-wafer interconnect node;
the plurality of driver circuits and the voltage supply node formed in a substrate of the driver die with each corresponding one of the plurality of driver circuits and the voltage supply node pair electrically isolated from one another within the substrate to an upper surface thereof with trench isolation;
the plurality of light-emitting diodes including a first portion for a first color, a second portion for a second color, and a third portion for a third color respectively obtained from a first, a second, and a third wafer;
wherein the plurality of driver circuits are respectively interconnected to the plurality of light-emitting diodes through hybrid bonding directly between the driver die and respectively each of the first, the second, and the third wafer;
wherein the first wafer-to-wafer interconnect node and the second wafer-to-wafer interconnect node associated with each of the plurality of driver circuits have corresponding contact surfaces corresponding to the upper surface of the substrate for the hybrid bonding to form a plurality of hybrid bonds directly with the plurality of light-emitting diodes; and
wherein the first, the second, and the third color are different from one another.

2. The light-emitting diode display according to claim 1, wherein a largest pitch of adjacent ones of the plurality of light-emitting diodes is not greater than 5 microns.

3. The light-emitting diode display according to claim 2, wherein the diode has a side dimension that is not greater than 10 microns.

4. The light-emitting diode display according to claim 1, wherein a largest pitch of adjacent ones of the plurality of light-emitting diodes is not greater than 50 microns.

5. The light-emitting diode display according to claim 4, wherein the diode has a side dimension that is not greater than 100 microns.

6. The light-emitting diode display according to claim 1, wherein a largest pitch of adjacent ones of the plurality of light-emitting diodes is not greater than 500 microns.

7. The light-emitting diode display according to claim 6, wherein the diode has a side dimension that is not greater than 1000 microns.

8. A method for forming a light-emitting diode display, comprising:
obtaining a driver wafer having a plurality of driver circuits;
wherein each of the plurality of driver circuits have a first wafer-to-wafer interconnect node associated with a voltage supply node as a second wafer-to-wafer interconnect node;
obtaining at least a first, a second, and a third wafer respectively having a first, a second, and a third plurality of light-emitting diodes for a first, a second, and a third color, respectively;
positioning the at least the first, the second, and the third wafer for successively selectively applying a beam for releasing the first, the second, and the third plurality of light-emitting diodes on the driver wafer in first positions, second positions, and third positions, respectively, to provide pixels for the light-emitting diode display;
wherein the at least the first, the second, and the third wafer are laterally shifted for keying with respect to one another for direct placement of multiple ones of each of the first, the second, and the third plurality of light-emitting diodes at a time between other multiple ones of each of the first, the second, and the third plurality of light-emitting diodes of a different color for wafer-to-wafer assembly;
interconnecting the plurality of driver circuits respectively to the first, second and third plurality of light-emitting diodes through hybrid bonding directly between the driver die and respectively each of the first, the second, and the third wafer;
wherein each discrete diode of the first, the second, and the third plurality of light-emitting diodes released has a thickness of no more than 10 microns respectively interconnected to the plurality of driver circuits between a corresponding one of the first wafer-to-wafer interconnect node and the second wafer-to-wafer interconnect node;
wherein the plurality of driver circuits and the voltage supply node are formed in a substrate of the driver die with each corresponding one of the plurality of driver circuits and the voltage supply node associated pair electrically isolated from one another within the substrate to an upper surface thereof with trench isolation;
wherein the first wafer-to-wafer interconnect node and the second wafer-to-wafer interconnect node associated with each of the plurality of driver circuits have corresponding contact surfaces corresponding to the upper surface of the substrate for the hybrid bonding to form a plurality of hybrid bonds directly with the plurality of light-emitting diodes; and
wherein the first, the second, and the third color are different from one another.

9. The method according to claim 8, wherein the selectively positioning and the successively selectively applying comprise:
positioning the first wafer proximate to an interconnect layer for the plurality of hybrid bonds directly bonded with the plurality of light-emitting diodes;
selectively applying a beam to the first wafer to release at least one of the first plurality of light-emitting diodes from the first wafer to the interconnect layer for interconnection with a first portion of the plurality of driver circuits at the first positions;
positioning the second wafer proximate to the interconnect layer;
selectively applying the beam to the second wafer to release at least one of the second plurality of light-emitting diodes from the second wafer to the interconnect layer for interconnection with a second portion of the plurality of driver circuits at the second positions;
positioning the third wafer proximate to the interconnect layer; and
selectively applying the beam to the third wafer to release at least one of the third plurality of light-emitting diodes from the third wafer to the interconnect layer for interconnection with a third portion of the plurality of driver circuits at the third positions.

10. The method according to claim 8, further comprising:
plasma activating upper surfaces of the driver wafer for providing the interconnect layer;
forming masking layers on portions of the first, the second and the third wafer; and
the hybrid bonding including bonding unmasked portions of the first, the second and the third wafer to corresponding plasma activated surfaces of the driver wafer.

11. The method according to claim 9, wherein the selectively applying of the beam for releasing the at least one of each of the first, the second, and the third plurality of light-emitting diodes is for electrical interconnection through the interconnect layer with corresponding ones of the plurality of driver circuits.

12. The method according to claim 11, wherein the positioning of the first, the second, and the third wafer comprises:
respectively positioning the first, the second, or the third wafer proximate to the interconnect layer with a first, a second, or a third substrate, respectively thereof, on an opposite side of the driver wafer with respect to proximity to the interconnect layer; and
respectively suspending the first, the second, or the third wafer above an upper surface of the interconnect layer for selectively successively releasing the respective pluralities of the first, the second, and the third plurality of light-emitting diodes from the first, the second, and the third substrate, respectively, for successively being released onto the upper surface.

13. The method according to claim 12, wherein the positioning of the first, the second, and the third wafer comprises re-orienting either or both the driver wafer or one of the first, the second, or the third wafer with respect to one another to key at least one of the respective pluralities of the first, the second, or the third plurality of light-emitting diodes attached to the interconnect layer to another one of the respective pluralities of the one of the first, the second, or the third plurality of light-emitting diodes attached to the first, the second, and the third substrate, respectively.

14. The method according to claim 13, wherein the interconnect layer is a first interconnect layer, the method further comprising applying a second interconnect layer to the wafer with the respective pluralities the first, the second, and the third plurality of light-emitting diodes attached thereto.

15. The method according to claim 13, further comprising:
repositioning the first wafer proximate to the interconnect layer;
selectively applying the beam to the first wafer to release a remainder of the first plurality of light-emitting diodes from the first substrate for contact with the interconnect layer for interconnection with a fourth portion of the plurality of driver circuits; and
wherein the first color is green.

16. A light-emitting diode display, comprising:
a driver die having a plurality of driver circuits;
each of the plurality of driver circuits having a first wafer-to-wafer interconnect node;
each of the plurality of driver circuits associated with a voltage supply node as a second wafer-to-wafer interconnect node;
a plurality of discrete light-emitting diodes each diode having a thickness of 10 microns or less and respectively interconnected to the plurality of driver circuits between a corresponding one of the first wafer-to-wafer interconnect node and the second wafer-to-wafer interconnect node;
the plurality of driver circuits and the voltage supply node formed in a substrate of the driver die with each corresponding one of the plurality of driver circuits and the voltage supply node pair electrically isolated from one another within the substrate to an upper surface thereof with trench isolation;
the plurality of light-emitting diodes including a first portion for a first color, a second portion for a second color, and a third portion for a third color respectively obtained from a first, a second, and a third wafer;
wherein the plurality of driver circuits are respectively interconnected to the plurality of light-emitting diodes through bonding directly between the driver die and respectively each of the first, the second, and the third wafer;
wherein the first wafer-to-wafer interconnect node and the second wafer-to-wafer interconnect node associated with each of the plurality of driver circuits have corresponding contact surfaces corresponding to the upper surface of the substrate for the bonding to form a plurality of bonds directly with the plurality of light-emitting diodes; and
wherein the first, the second, and the third color are different from one another.

17. The light-emitting diode display according to claim 16, wherein a largest pitch of adjacent ones of the plurality of light-emitting diodes is not greater than 5 microns.

* * * * *